United States Patent

Hirukawa et al.

Patent Number: 5,615,006
Date of Patent: Mar. 25, 1997

[54] IMAGING CHARACTERISTIC AND ASYMETRIC ABRERRATION MEASUREMENT OF PROJECTION OPTICAL SYSTEM

[75] Inventors: Shigeru Hirukawa, Kashiwa; Shinjiro Kondo, Tokyo; Takeshi Kato, Kawasaki; Kyoichi Suwa, Yokohama, all of Japan

[73] Assignee: Nikon Corporation, Tokyo, Japan

[21] Appl. No.: 469,514

[22] Filed: Jun. 6, 1995

Related U.S. Application Data

[63] Continuation of Ser. No. 355,219, Dec. 8, 1994, abandoned, which is a continuation of Ser. No. 130,446, Oct. 1, 1993, abandoned.

[30] Foreign Application Priority Data

Oct. 2, 1992 [JP] Japan .................................. 4-264659
Oct. 2, 1992 [JP] Japan .................................. 4-264660

[51] Int. Cl.$^6$ ..................... G01B 9/00; G01M 11/00
[52] U.S. Cl. .................. 356/124; 356/124.5; 356/127
[58] Field of Search ............................. 356/401, 394, 356/124, 124.5, 127; 250/548

[56] References Cited

U.S. PATENT DOCUMENTS

| | | | |
|---|---|---|---|
| 4,585,342 | 4/1986 | Lin et al. | 356/124 |
| 4,629,313 | 12/1986 | Tanimoto | 355/53 |
| 4,650,983 | 3/1987 | Suwa | 250/204 |
| 4,677,301 | 6/1987 | Tanimoto et al. | 250/548 |
| 4,750,836 | 6/1988 | Stein | 356/401 |
| 4,755,750 | 7/1988 | Leuschner | 356/401 |
| 4,759,626 | 7/1988 | Kroko | 356/124 |
| 4,853,745 | 8/1989 | Kamiya et al. | 356/401 |
| 4,908,656 | 3/1990 | Suwa et al. | 356/401 |
| 4,962,318 | 10/1990 | Nishi | 250/548 |
| 5,151,750 | 9/1992 | Magome et al. | 356/401 |
| 5,216,257 | 6/1993 | Brueck et al. | 250/548 |
| 5,296,917 | 3/1994 | Kusonose et al. | 356/401 |
| 5,313,272 | 5/1994 | Nose et al. | 356/401 |
| 5,402,224 | 3/1995 | Hirukawa et al. | 356/124 |

*Primary Examiner*—Frank Gonzalez
*Assistant Examiner*—Jason D. Eisenberg
*Attorney, Agent, or Firm*—Shapiro and Shapiro

[57] ABSTRACT

A method of exposing images of measuring patterns formed on a mask on a photosensitive substrate through a projection optical system, measuring positional deviation quantities of the exposed images of the measuring patterns in a measuring direction and thus measuring imaging characteristics of the projection optical system on the basis of the measured positional deviation quantities. In this method, periodic patterns are used as the measuring patterns, wherein bright and dark portions are arranged at a predetermined pitch in a direction corresponding to the measuring direction. The positional deviation quantity is measured by assuming the image of the periodic pattern as an image of the pattern consisting of the single dark portion on the whole when measuring the positional deviation quantity of the periodic pattern image exposed on the photosensitive substrate in the measuring direction. The mask may be formed with measuring marks in which a plurality of pattern units consisting of periodic patterns having bright and dark portions arranged at the predetermined pitch are arranged in lattice at an interval larger than the predetermined pitch.

11 Claims, 19 Drawing Sheets

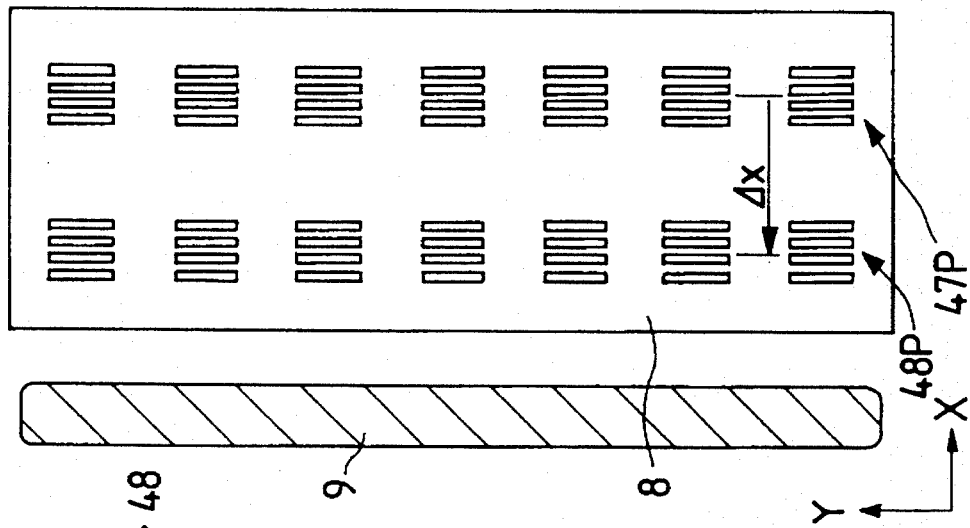
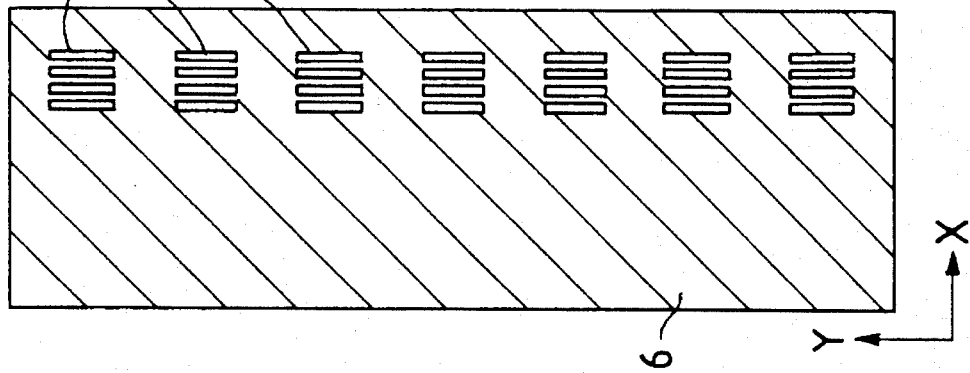
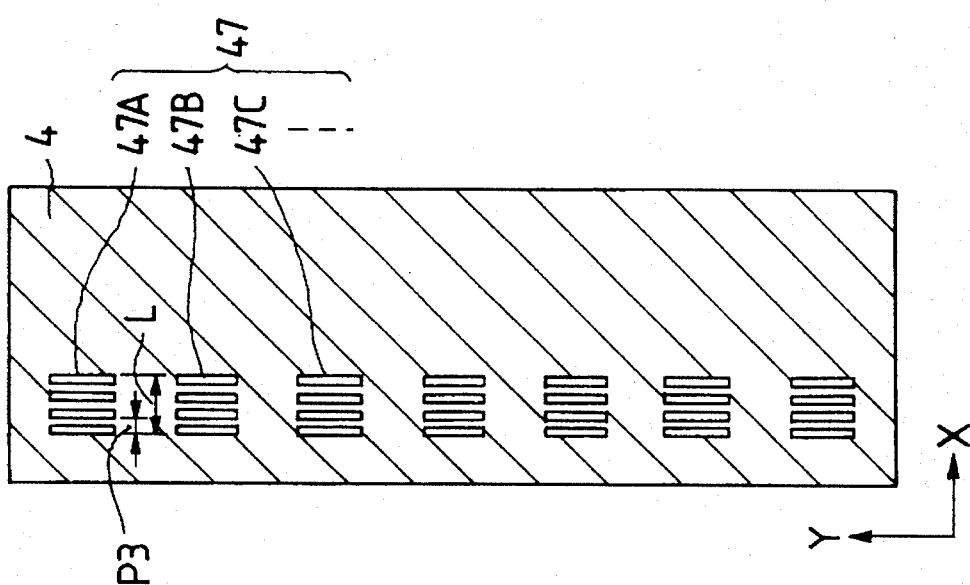

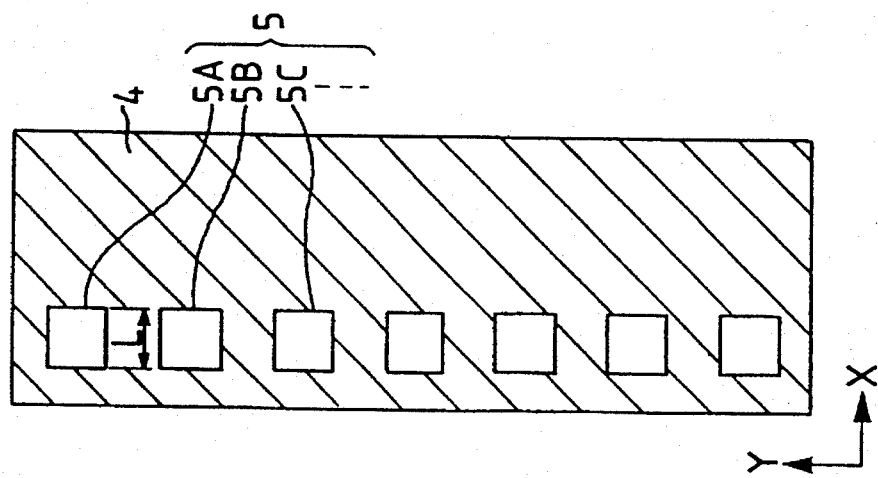
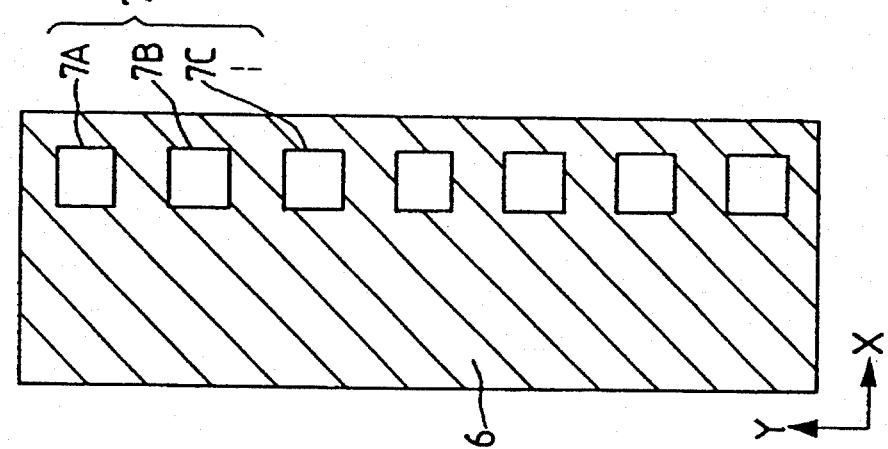
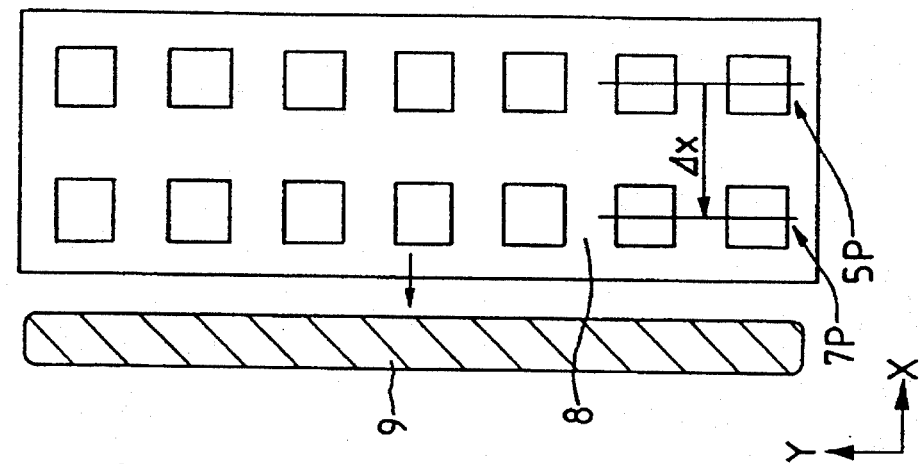

IMAGING CHARACTERISTIC AND ASYMETRIC ABRERRATION MEASUREMENT OF PROJECTION OPTICAL SYSTEM

This is a continuation of application Ser. No. 08/355,219 filed Dec. 8, 1994, which is a continuation of application Ser. No. 08/130,446 filed Oct. 1, 1993, both abandoned.

BACKGROUND OF THE INVENTION

1. Field of the Invention

The present invention relates generally to a technique of measuring imaging characteristics of a projection optical system and, more particularly, to a measuring method suited to measure the imaging characteristics such as an asymmetric aberration like, e.g., a distortion or a comatic aberration of the projection optical system incorporated into a projection exposure apparatus employed in a lithography step for manufacturing a semiconductor element, a liquid crystal display element or a thin-film magnetic head, etc.

2. Related Background Art

In the lithography step for manufacturing a semiconductor element, a liquid crystal display element or a thin-film magnetic head, etc., there has been employed the projection exposure apparatus for imaging patterns on a photo mask or a reticle (hereinafter generally termed [reticle]) on a photosensitive substrate through the projection optical system. Generally, in the semiconductor element or the like, multi-layered circuit patterns are formed in superposition on a substrate. At the same time, for example, the projection exposure apparatus for exposing the circuit pattern of the first layer is different from a projection exposure apparatus for exposing the circuit pattern of the second layer. Accordingly, an overlay accuracy of the circuit patterns is kept high, and there is increased a yield of the semiconductor element or the like that is to be finally manufactured. For this purpose, it is required that a magnification error of the projection optical system and the imaging characteristics such as the distortion be maintained within predetermined standards. To fulfill this, the imaging characteristics of the projection optical system are at first required to be accurately measured. A known conventional measuring method is disclosed in, e.g., U.S. Pat. No. 4,629,313 and U.S. Pat. No. 4,908,656. Exemplifying the distortion as the imaging characteristic of the projection optical system, the measuring method thereof will hereinafter be explained.

A test reticle R1 as shown in FIG. 7 has hitherto been employed for measuring the distortion of the projection optical system. Referring to FIG. 7, a fiducial mark 2 is formed in the central portion of a test reticle R. The fiducial mark 2 consists of two-line-and-space patterns 1A, 1B arranged at a predetermined interval in an X-direction. Measuring marks 3A to 3D each consisting of a 3-line-and-space pattern are formed at four corners of the test reticle R1. An X-directional (measurement-directional) width of a dark or bright part of each of the fiducial mark 2 and the measuring marks 3A to 3D is on the order of 4 to 6 µm. This width is set to a value optimized in accordance with a resolving power of a sensor for detecting images of these fiducial and measuring marks.

Then, when measuring the distortion, the measuring marks 3A to 3D on the test reticle R are illuminated with the light. In this state, the fiducial mark 2 is exposed (first exposure) on a wafer W through the projection optical system while sequentially moving the photosensitive substrate (e.g., the wafer coated with a resist) W. In consequence of this, as illustrated in FIG. 8A, latent images 2AP to 2DP of the fiducial mark 2 are formed on the wafer W. Forming positions of these latent images 2AP to 2DP coincide with projecting positions of the measuring marks 3A to 3D in FIG. 7 in terms of design on the wafer W. Next, the wafer W formed with the latent images 2AP to 2DP is positioned in a predetermined position. Thereafter, the images of the measuring marks 3A to 3D of the test reticle R1 are exposed (second exposure) in superposition on the water W through the projection optical system. As a result, the latent images 3AP to 3DP of the measuring marks are, as depicted in FIG. 8B, formed in between the latent images 2AP to 2DP respectively on the wafer W. Note that a dotted line in FIG. 8B indicates a projection region of the test reticle R1 when in the second exposure.

Next, the wafer W undergoing the first and second exposures is developed. The two latent images 2AP to 2DP of the fiducial mark 2 and the latent images 3AP to 3DP of the measuring marks are thereby formed in the shape of recessed or projected resist patterns on the wafer. These resist patterns can be viewed by use of, e.g., a microscope (or an SEM). FIG. 9A is an enlarged view showing the latent image 2DP of the fiducial mark and the latent image 3DP of the measuring mark in FIG. 8B. An X-directional difference $\Delta x1$ is measured between the center of the latent image 2DP and the center of the latent image 3DP. Similarly, there are measured differences between the centers of three sets of remaining latent images in FIG. 8B (e.g., an X-directional difference $\Delta x4$ between the center of the latent image 2AP and the center of the latent image 3AP). An X-directional distortion of the projection optical system can be thereby obtained. Note that the above difference is, as a matter of fact, obtained by detecting not the latent images but the resist patterns.

Next, one example of the measuring marks suitable for a conventional laser step alignment (LSA) method will be explained with reference to FIGS. 10A to 10C. The LSA method is disclosed in, e.g., U.S. Pat. No. 4,677,301, wherein when a diffraction grating mark is relatively scanned with an elongate band-like spot beam formed on the wafer, a beam of diffraction light generated from the mark is photoelectrically detected.

FIG. 10A illustrates a first measuring mark 5 formed on the reticle and corresponding to the fiducial mark 2 in FIG. 7. This first measuring mark 5 is formed such that square aperture patterns 5A, 5B, 5C, ... each having one side dimensioned L are arranged at a pitch 2L in a direction (Y-direction) perpendicular to a measuring direction (X-direction) in a light shielding portion (chromium layer) 4. The width of each of the aperture patterns 5A, 5B, ... is on the order of 4 to 6 µm. FIG. 10B also illustrates a second measuring mark 7 corresponding to the measuring marks 3A to 3D in FIG. 7. This second measuring mark 7 is also formed such that square aperture patterns 7A, 7B, 7C, ... each having the width L are arranged at the pitch 2L in the Y-direction in a light shielding portion.

Then, the first and second measuring marks 5, 7 are sequentially exposed on the wafer, and developing thereof is effected essentially by the same actions as the above-mentioned. As depicted in FIG. 10C, first and second recessed measuring mark images 5P, 7P are formed in a positive type resist 8. If the resist is of a negative type, however, the first and second measuring mark images 5P, 7P are formed as projected portions. Next, as illustrated in FIG. 10C, a spot beam 9 extending in the Y-direction falls on the wafer after being developed. In this state, the wafer is scanned in the X-direction. Note that an X-directional width of the spot beam 9 is approximately equal to the X-directional width of the measuring mark image 5P or 7P. When the measuring mark image 5P or 7P coincides with the spot beam 9 in the middle of scanning, the intensive diffraction light is generated in a predetermined direction. It is therefore possible to detect an X-directional position in which the measuring mark image 5P or 7P coincides with the spot beam 9. With this detection, there is obtained an X-directional interval Δx from the first measuring mark image 5P existing in an ideal position in terms of design to the second measuring mark image 7P. This interval Δx corresponds to a distortion of the projection optical system.

Next, one example of a measuring mark by the conventional Moiré method will be explained with reference to FIGS. 11A to 11C. Turning to FIG. 11A, light transmitting (or shielding) patterns 10A, 10B, 10C, . . . each assuming a triangular waveform are arranged at a pitch Q1 in the Y-direction on the reticle. These patterns form the first measuring mark corresponding to the fiducial mark 2 in FIG. 7. Further, for light transmitting (or shielding) patterns 11A, 11B, 11C, . . . each assuming the triangular waveform are arranged at the pitch Q1 in the Y-direction. These patterns form the second measuring mark corresponding to the measuring marks 3A to 3D in FIG. 7. The pitch Q1 is substantially equal to the pitch of the measuring mark 3A in FIG. 7. The patterns 11A, 11B, 11C . . . are shown in superposition on the first measuring mark in order to facilitate understanding of FIGS. 11A and 11B. As a matter of fact, the first and second measuring marks are formed in portions different from each other on the reticle.

The first and second measuring marks are sequentially exposed on the wafer, thus performing the development. Then, as illustrated in FIG. 11B, the overlaid portions of the first and second recessed or projected measuring marks are left as overlaid images 12P consisting of rhombic patterns 12AP to 12EP in the resist film. Let Lx be an X-directional length of each of the rhombic patterns 12AP to 12EP. This length Lx is obtained by enlarging a Y-directional crosswise deviation quantity between the first and second measuring mark images in FIG. 11A in accordance with the principle of Moiré fringes. It is therefore possible to highly accurately measure the Y-directional crosswise deviation quantity between the first and second measuring mark images, i.e., a Y-directional distortion by measuring differences Lx1, Lx2 of the positions thereof from a detection signal S shown in FIG. 11C.

Referring further to FIG. 11B, overlaid images 13P, 14P consisting of rhombic patterns are similarly formed in the X-direction with respect to the overlaid images 12P. Then, for measuring the X-directional length Lx of each rhombus, the wafer is scanned in the X-direction in a state where the spot beam 9 extending in the Y-direction falls on the wafer after being developed. If the overlaid images 12P to 14P are overlapped with the spot beam 9 in the middle of scanning, the diffraction light is generated in the predetermined direction. For this reason, it is feasible to detect the X-directional positional differences Lx1, Lx2 with which the respective overlaid images 12P to 14P are overlapped with the spot beam 9. A distortion quantity ΔY=(Lx2−Lx1)/k can be measured at a high accuracy by using values of Lx1, Lx2 and an enlargement magnification k of the Moiré mark. The measuring principle by the Moiré method is disclosed in U.S. patent application Ser. No. 984,558 (filed on Dec. 2, 1992).

Next, there will be explained one example of the measuring mark by a conventional box-in-box method with reference to FIGS. 12A to 12C. The box-in-box method is a method capable of simultaneously measuring X- and Y-directional positional deviation quantities through a pair of marks. FIG. 12A illustrates a first measuring mark 15 corresponding to the fiducial mark 2 of FIG. 7 on the reticle. This first measuring mark 15 is a square pattern consisting of a light shielding portion (chromium layer). FIG. 12B also illustrates a second measuring mark 16 corresponding to the measuring marks 3A to 3D in FIG. 7. This second measuring mark 16 includes a square aperture (light transmitting) pattern 17 formed at the center of the square light shielding pattern. Widths of the first measuring mark 15 and of the aperture pattern 17 at the center of the second measuring mark 16 take values each larger than 4 to 6 μm.

The first and second measuring marks 15, 16 are sequentially exposed on the wafer, thus effecting the development thereof. Then, as shown in FIG. 12C, edges of the resist film 18 are formed with an edge portion 15P of the first measuring mark image and an edge portion 17P of the image of the aperture pattern 17 at the center of the second measuring mark. Subsequently, these measuring mark images are scanned with the spot beam in the X- and Y-directions. It is thereby possible to obtain a positional deviation quantity Δx between the X-directional center of the edge portion 15P and the X-directional center of the edge portion 17P. Obtained also is a positional deviation quantity Δy between the Y-directional center of the edge portion 15P and the Y-directional center of the edge portion 17P. The X- and Y-directional distortions of the projection optical system can be obtained respectively from these positional deviation quantities Δx, Δy.

As discussed above, in the measuring marks or the fiducial mark for the distortion of the conventional projection optical system, the width of the light shielding or transmitting portion is set to 4 to 6 μm in accordance with a resolving power, etc. of a sensor for detecting the image projected on the photosensitive substrate. In contrast with this, the width of the light shielding or transmitting portion of the pattern is going to be smaller than 0.5 μm, the pattern being such as a reticle circuit pattern or the like (hereinafter called [actual element pattern]) which is conceived as an actually transferred object. For this reason, a characteristic measured with the mark for measuring the distortion differs from the distortion characteristic with respect to the actual element pattern. This leads to such a drawback that the distortion with respect to the actual element pattern cannot be accurately measured.

It can be also considered that the pitches of, e.g., the measuring mark images 2DP, 3DP in FIG. 9A are simply reduced for measuring the characteristic corresponding to the actual element pattern, and, as illustrated in FIG. 9B, a fiducial mark image 20P and a measuring mark image 21P are formed. It is, however, difficult for the conventional sensor to measure the whole positional deviation quantities by measuring positions of the rectilinear patterns as done for such hyperfine patterns.

Given next is an explanation of a difference between the imaging characteristics when a line width of the fiducial or measuring mark is different from a line width of the actual element pattern.

FIG. 13A shows a test reticle R1 formed with a measuring mark 3A. FIG. 13B illustrates a reticle R2 formed with an actual element pattern 19. In this case, it is assumed that the measuring mark 3A is a line-and-space pattern in which a width of the light shielding or transmitting portion is 4 to 6 μm. The actual element pattern 19 is, it is also assumed, a line-and-space pattern in which a width of the light shielding or transmitting portion is 0.5 μm. Further, a diffraction angle θ of nth-order diffraction light coming from the pattern satisfies the following equation:

$$p \cdot \sin \theta = n \cdot \lambda$$

where λ is the wavelength of the exposure light IL with which the reticle is illuminated, and p is the pitch of the illuminated pattern.

Namely, the diffraction angle θ of the diffraction light of the same order increases with a more infinitesimal pattern pitch. The diffraction light travels through a position far from the optical axis on the pupil plane of the projection optical system. Accordingly, the diffraction light from the measuring mark 13A in FIG. 3A passes through a position close to the optical axis on the pupil plane of the projection optical system. The diffraction light from the actual element pattern 19 in FIG. 13B passes through a position apart from the optical axis on the pupil plane of the projection optical system. If surface configurations and refractive indexes of optical members constituting the projection optical system deviate from ideal values, a variety of aberrations are caused due to a difference between the positions through which the light passes on the pupil plane. Especially when a comatic aberration remains as it is, an imaging position, as shown in FIG. 13C, differs corresponding to the passage positions on the pupil plane of the projection optical system PL. As a result, the distortion differs. For this reason, it follows that the characteristic measured with the measuring mark 3A is different from the characteristic with respect to the actual element pattern 19.

In the case of using a normal illumination method in which a conventional coherence factor (σ-value) is on the order of 0.5, as illustrated in FIGS. 14A and 14B, both of diffraction light DL+ and diffraction light DL− from the patterns on the reticles R1, R2 contain the beams of light passing in the vicinity of the optical axis of the projection optical system PL. Hence, the diffraction light from the measuring mark having a larger pattern pitch as shown in FIG. 14A and also the diffraction light from the actual element pattern having a smaller pattern pitch as shown in FIG. 14B respectively travel through an extremely wide range on the pupil plane of projection optical system PL. Therefore, a difference between the imaging characteristics is quite small.

Contrastingly, in the case of using a phase-shift method with a small coherence factor of the illumination or a transform illuminant method (oblique illumination method) of restricting the illumination light passing through the pupil plane of the illumination optical system in at least one segmented area eccentric from the optical axis, the diffraction light from the reticle pattern contains almost no component traveling in the vicinity of the optical axis of the projection optical system. Consequently, there is produced a large difference between the imaging characteristics of the projection optical system depending on the pattern pitches. FIG. 15A illustrates how a phase-shift reticle R3 formed with a large-pitch pattern is illuminated with a beam of light. FIG. 15B shows how a phase-shift reticle R4 formed with a fine-pitch pattern is illuminated with the beam. In this case, the passage positions of the diffraction light DL+ and the diffraction light DL− on the pupil plane of the projection optical system PL, differ depending on the pitches. That is, a state of aberration differs. A difference between these pattern imaging positions is also caused. This is substantially the same as employing the transform illuminant method. Note that the transform illuminant method is disclosed in, e.g., U.S. patent application Ser. No. 791,138 (filed on Nov. 13, 1991) and U.S. patent application Ser. No. 847,030 (filed on Apr. 15, 1992).

To summarize, when using the projection optical system PL in which, for instance, the asymmetric aberration such as a comatic aberration exists, it is impossible to accurately obtain the distortion with respect to the actual element pattern having a small pitch by measuring the distortion through the conventional large-pitch measuring pattern. Consequently, there arises a drawback of inducing a decline of the overlay accuracy when forming the multi-layered circuit patterns on the photosensitive substrate.

Further, when checking the asymmetric aberration such as the comatic aberration, etc., among the imaging characteristics of the projection optical system, the check pattern such as a line-and-space pattern has hitherto been printed on the wafer. Then, an asymmetric quantity of a resist image of the check pattern formed on the wafer by the developing process is measured by use of a scan type electronic microscope (SEM) or the like. A comatic aberration quantity of the projection optical system is calculated from this measured result. However, measuring the resist pattern by a high-accuracy measuring apparatus separate from the projection exposure apparatus presents such drawbacks that the whole measuring system is complicated and expensive, and the measurement of the aberration is very time-consuming. In addition, for measuring the asymmetric aberration of the projection optical system, it is desirable that the number of measuring points in an exposure field of the projection optical system be increased as much as possible. It is, however, difficult to increase the number of measuring points, if the measurement takes much time as in the prior art.

SUMMARY OF THE INVENTION

It is a primary object of the present invention to provide an imaging characteristic measuring mask and an imaging characteristic measuring method capable of accurately measuring imaging characteristics (a distortion or an asymmetric aberration, etc.) of a projection optical system with respect to an actual element pattern having a small pitch without increasing a resolving power of a sensor for detecting a mark image on a substrate.

To accomplish this object, according to one aspect of the present invention, (referring, e.g., to FIGS. 1, 2A, and 2B) there is provided a method of exposing images of measuring patterns formed on a mask (29) on a photosensitive substrate (33) through a projection optical system (31), measuring positional deviation quantities of the exposed images of the measuring patterns in a predetermined measuring direction and thus measuring imaging characteristics of the projection optical system (31) on the basis of the measured positional deviation quantities. The method comprises the steps of using, as the measuring patterns, periodic patterns (40A) in which bright and dark portions are arranged at a predetermined pitch (P2) in a direction corresponding to the measuring direction. The method also comprises the step of measuring the positional deviation quantity by assuming the image of the periodic pattern (40A) as an image of the pattern consisting of the single dark portion on the whole when measuring the positional deviation quantity of the periodic pattern (40A) image exposed on the photosensitive substrate (33) in the measuring direction.

Further, according to another aspect of the invention, there is provided a mask comprising measuring marks (39A) including, as illustrated in FIGS. 2A to 2C, a plurality of pattern units (40A, 40B, 40C) consisting of periodic patterns (41, 42) having bright and dark portions arranged at a predetermined pitch (P2), the pattern units (40A, 40B, 40C) being arranged in lattice at an interval (P1) larger than the pitch (P2).

The pitch (P2) of the periodic pattern (40A) serving as a measuring pattern on the mask (29) is set substantially equal to the pitch of the actual element pattern conceived as an object to be measured in the measuring direction. Particularly when the actual element pattern is a phase-shift pattern, the periodic pattern (40A) is also, as shown in, e.g., FIG. 2B, configured as a phase-shift type in which phase shifters (42) are formed alternately at one pitch. It is possible to precisely obtain the imaging characteristics with respect to the actual element pattern by measuring the imaging characteristics of the projection optical system by use of the periodic patterns (40A).

Moreover, if the actual element pattern has a small pitch, it is difficult to measure a width of each dark or bright portion of the periodic pattern (40A) in the case of a position measuring sensor having the same resolving power as the conventional one. Under such circumstances, according to the present invention, an edge position or a central position is measured by assuming the image of the periodic pattern (40A) as a single dark line on the whole. It is thereby possible to measure the positional deviation quantity of the image of the periodic pattern (40A) without increasing the resolving power of the sensor for measuring the position.

Further, the imaging characteristics of the projection optical system (31) are measured by use of the mask (29) including the measuring marks (39A) in which the plurality of pattern units (40A, 40B, 40C) consisting of the periodic patterns (41, 42) are arranged in lattice at the interval (P1) larger than the pitch (P2). In this case, the image of each of the pattern units (40A to 40C) is conceived as a single dark line pattern, and the edge or central position is measured. Then, the positional deviation quantity of the image of the measuring pattern can be accurately obtained by averaging the measured results.

According to a second method of measuring an imaging characteristic, (particularly, the asymmetric aberration of the projection optical system,) as illustrated in FIGS. 16 to 18B, a position (focus position) of a photosensitive substrate (111) in the optical axis direction of a projection optical system (109) is fixed. An image of a first measuring pattern (126-1) as a mask pattern (108) is projection-exposed in a plurality of shot areas (134-1, 134-2) on the photosensitive substrate. Next, an image of a second measuring pattern (127-1) as a mask pattern is projected in a plurality of shot areas (134-1, 134-2) on the photosensitive substrate while shifting the focus position of the photosensitive substrate. Obtained further is a positional deviation quantity between the image of the first measuring pattern (126-1) and the image of the second measuring pattern (127-1) in every shot area. This positional deviation quantity is approximated by a function of the focus position. Then, an asymmetric aberration in projecting positions of the first and second measuring patterns of the projection optical system is obtained from a component symmetric with respect to the focus position relative to this function.

Additionally, in the second method of measuring an asymmetric aberration according to this invention, as shown in, e.g., FIGS. 16, 21A and 21B, a mask (107B) formed with a measuring mark (137-1) is disposed on the side of an object plane of the projection optical system (109). At the same time, a mark plate (118) formed with fiducial marks (119X, 119Y) is placed on a stage (110). Subsequently, the position (focus position) of the mark plate in the optical axis direction of the projection optical system is fixed. The mark plate is scanned within a plane perpendicular to the optical axis of the projection optical system. At this time, the light generated from the mark plate and passing through the projection optical system is received through the measuring mark on the mask, thereby detecting the position of the measuring mark on a stage moving coordinate system. Next, the focus position of the mark plate is shifted, and, thereafter, the mark plate is similarly scanned within the plane perpendicular to the optical axis of the projection optical system. The position of the measuring mark on the mask is thereby detected. Furthermore, the detected position of the measuring mark is approximated by the function of the focus position. Simultaneously, the asymmetric aberration in the projecting position of the measuring mark of the projection optical system is obtained from the component symmetric with respect to the focus position relative to this function.

The principle of the method of measuring the asymmetric aberration according to this invention will now be discussed. For example, if a telecentric property on the side of the photosensitive substrate of the projection optical system is incorrect, the image of the mask pattern is exposed on the photosensitive substrate while shifting the position (focus position) of the photosensitive substrate in the optical axis direction of the projection optical system by driving the stage. Then, there shifts the position of the mask pattern image within the plane perpendicular to the optical axis of the projection optical system, corresponding to the focus position.

Consider a projected image through the projection optical system which is a lattice-like pattern image (132XP) in which the patterns are arranged at a predetermined pitch in the X-direction as shown in, e.g., FIG. 18B. In this case, if an X-directional asymmetric aberration such as the comatic aberration exists in the projection optical system, it is known that the position of the pattern image moves in the direction opposite to the direction of the asymmetric aberration, irrespective of a defocus direction, as the photosensitive substrate moves away from the best focus position. Then, a pattern image position Tx is expressed as below by a quadratic function T1 (F) of the focus position F in combination with coefficients a, b, c by way of one example:

$$Tx = T1\ (F) = aF^2 + bF + c$$

The following is another example. The position Tx is expressed as below by a function T2 (F) including a sine function of the focus position F in combination with coefficients $\alpha$, $\beta$, $\gamma$, $\delta$ in an area within a predetermined range with, e.g., the best focus position being centered.

$$Tx = T2\ (F) = \alpha \cos(\beta F) + \gamma F + \delta$$

The position Tx can be expressed as a function in a variety of forms of the focus position F. Then, a quantity of the asymmetric aberration is expressed by the coefficient a representing a component symmetric with respect to the focus position F in, e.g., the function T1 (F) or by the coefficient $\alpha$ representing the component symmetric with respect to the focus position F in the function T2 (F). Accordingly, the position Tx of the pattern image (132XP) projected by the projection optical system is expressed as a function of the focus position F. Obtained beforehand is a relationship between the coefficient a or $\alpha$ indicating the component symmetric with respect to the focus position F and the asymmetric aberration quantity. The asymmetric aberration quantity can be thereby obtained from the value of the coefficient a or α.

Obtaining the above-mentioned function T1 (F) or T2 (F) may involve the measurement of the position of the pattern image through the projection optical system by shifting the focus position. There are, however, the following two measuring methods.

According to the first method, the image of the first measuring pattern is exposed on the photosensitive substrate while fixing the focus position. Next, the image of the second measuring pattern is exposed while shifting the focus position. Then, the position of the second measuring pattern image is measured based on the position of the first measuring pattern image. The position of the pattern image projected by the projection optical system can be thereby obtained as a function of the focus position. In this case, the high-accuracy scan type electronic microscope or the like is not particularly required to be employed for measuring the position of the second measuring pattern image on the basis of the position of the first measuring pattern image. For instance, the measurement can be executed by use of, e.g., an alignment sensor or the like provided in the projection exposure apparatus.

Further, according to the second method, the position of the measuring mark on the mask is detected by scanning the mark plate within the plane perpendicular to the optical axis of the projection optical system in each of the plurality of focus positions. The position of the pattern image projected by the projection optical system is thereby obtained as a function of the focus position. It is therefore possible to quickly obtain the position of the pattern image as a function of the focus position without effecting the exposure on the photosensitive substrate and employing the separate high-accuracy measuring apparatus.

BRIEF DESCRIPTION OF THE DRAWINGS

Other objects and advantages of the present invention will become apparent during the following discussion in conjunction with the accompanying drawings, in which:

FIG. 4A is an enlarged view illustrating a first measuring mark suitable for a laser step alignment method; FIG. 4B is an enlarged view showing a second measuring mark suitable for the laser step alignment method; FIG. 4C is an enlarged view illustrating projected images of the first and second measuring marks shown in FIGS. 4A and 4B;

FIG. 10A is an enlarged view showing a first measuring mark applied to the conventional laser step alignment method; FIG. 10B is an enlarged view illustrating a second measuring mark applied to the conventional laser step alignment method; FIG. 10C is an enlarged view showing the resist image formed through the first and second measuring marks;

Figure 22:
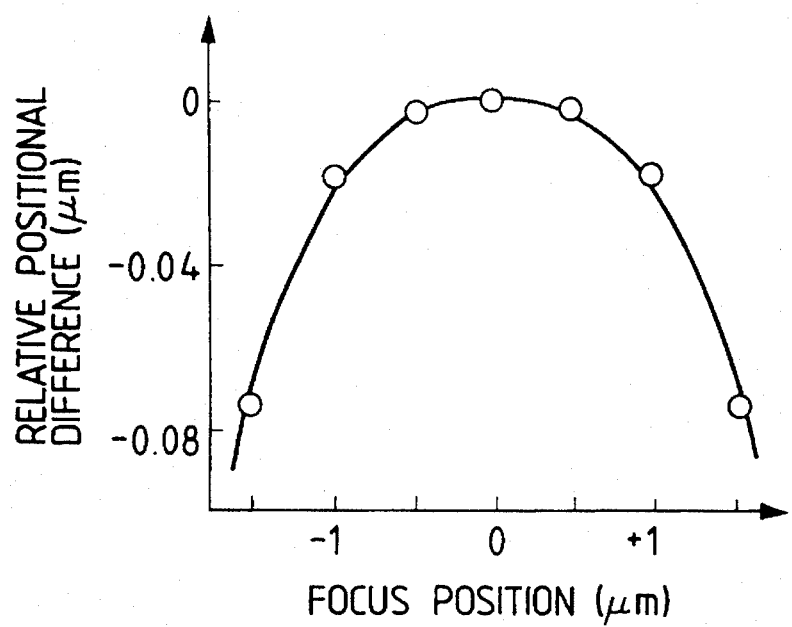
Figure 23:
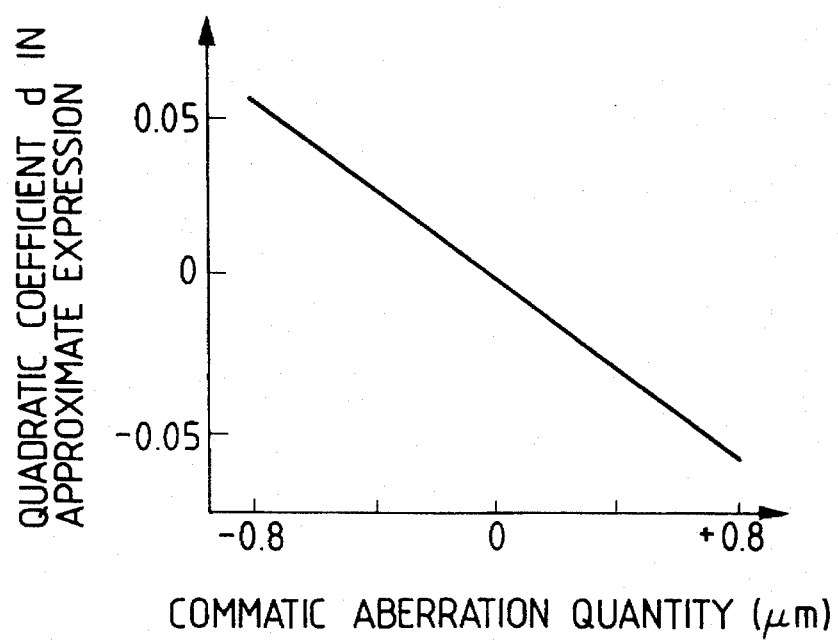

21B is an enlarged view showing a fiducial mark on a mark plate;

FIG. 22 is a view showing a relationship between the focus position and the relative positional difference in the third embodiment; and FIG. 23 is a view showing a relationship between a coefficient d of the square term in the approximate expression and a comatic aberration quantity in the third embodiment.

DESCRIPTION OF THE PREFERRED EMBODIMENTS

A first embodiment of the present invention will hereinafter be described with reference to FIGS. 1 to 6C. In this embodiment, the present invention is applied to a case where a distortion of a projection optical system is measured in a projection exposure apparatus.

Figure 1:
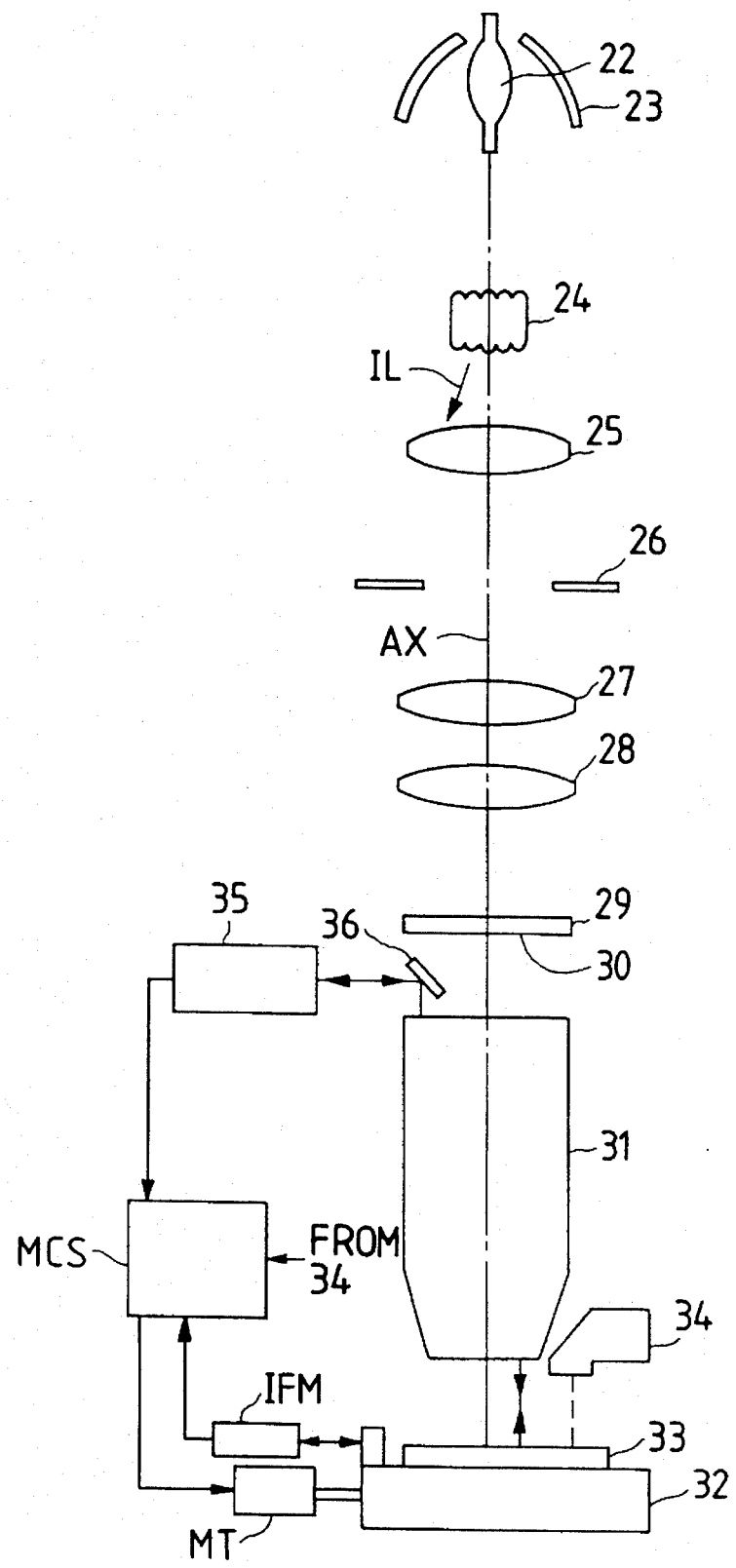
FIG. 1 is a view illustrating a construction of a projection exposure apparatus used in a first embodiment of this invention.

FIG. 1 is a schematic view illustrating a construction of the projection exposure apparatus employed in the first embodiment. Referring to FIG. 1, a beam of exposure light emitted from a super-high-pressure mercury lamp 22 is converged by an elliptical mirror 23. The exposure light is thereafter incident on a fly-eye lens 24 via an unillustrated input lens. A multiplicity of secondary illuminants are formed on a rear-side (reticle-side) focal plane of the fly-eye lens 24. Beams of exposure light IL outgoing from these secondary illuminants are passed through a first relay lens 25, a reticle blind 26, a second relay lens 27 and a condenser lens 28. A reticle 29 is thus illuminated with these beams of exposure light with a uniform illuminance. The reticle blind 26 is conjugate with a pattern forming plane of the reticle 29. An illumination area on the reticle 29 is arbitrarily set by the reticle blind 26.

A pattern image 30 is formed on a lower surface of the reticle 29. A projection optical system 31 projection-forms the image of the pattern 30 on a wafer 33 placed on a wafer stage 32. The rear-side focal plane of the fly-eye lens 24 is substantially conjugate with a pupil plane of the projection optical system 31. The wafer stage 32 is so constructed as to be two-dimensionally movable by means of a motor MT within the plane perpendicular to the optical axis of the projection optical system 31 and at the same time capable of making micromotions along the optical axis of the projection optical system 31. Further, X- and Y-directional positions of the wafer stage 32 are measured all the time by a laser interferometer IFM.

A wafer alignment system 34 based on an off-axis method, as disclosed in, e.g., U.S. Pat. No. 4,962,318, detects an alignment mark formed in the vicinity of each shot area on the wafer 33. A main control system MCS previously obtains an interval, a so-called baseline quantity, between a detecting center of the wafer alignment system 34 and a projecting position of the reticle. The main control system MCS is thereby capable of accurately aligning each shot area on the wafer 33 on the basis of the positions of the alignment marks, which have been measured by the wafer alignment system 34. Further, the wafer alignment system 34 detects an image of a measuring mark employed in this embodiment.

A laser step alignment (LSA) system 35 by a TTL method, as disclosed in, e.g., U.S. Pat. No. 5,151,750, forms a slit-like spot beam on the wafer 33 through the projection optical system 31 as well as through a mirror 36. Then, diffraction grating marks undergo relative scanning with respect to the spot beam while causing the micromotion of the wafer stage 32. At this time, beams of diffraction light generated from the marks are photoelectrically detected through the projection optical system 31 and a mirror 36. The main control system MCS inputs photoelectric signals from the alignment system 35 and positional signals from the interferometer IFM, thereby obtaining positions of the mark on the wafer in accordance with a predetermined calculation.

Figure 2A:
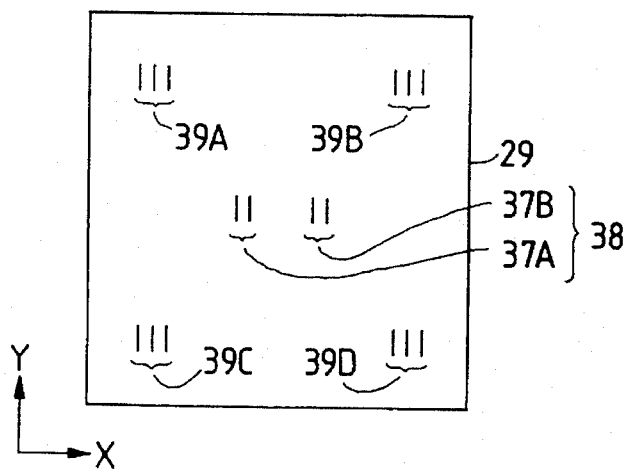
FIG. 2A is a view illustrating a reticle pattern used in the first embodiment of this invention.
Figure 2B:
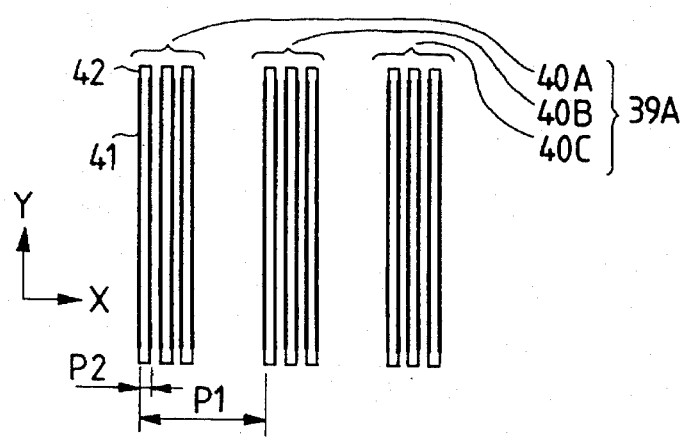
FIG. 2B is an enlarged view of the measuring mark in FIG. 2A.

FIG. 2A illustrates a specific configuration of the reticle 29 in FIG. 1. Referring to FIG. 2A, a fiducial mark 38 is formed at the central portion of the reticle 29. The fiducial mark 38 consists of two sets of periodic patterns 37A, 37B arranged at a predetermined spacing in the X-direction. Further, measuring marks 39A to 39D each consisting of three periodic patterns are formed at four corners of the reticle 29. Take the measuring mark 39A, for example, as shown in FIG. 2B, three identical periodic patterns 40A–40C are arranged at a pitch P1 in the X-direction defined as a measuring direction. The periodic pattern 40A is a line-and-space pattern 41 formed at a pitch P2 so that an X-directional entire width is approximately one-half of P1. Phase shifters 42 are formed alternately in bright portions (light transmitting portions) thereof. The phase shifter 42 is intended to make the exposure light out of phase 180 degrees, which passes therethrough. Note that the periodic patterns 40B, 40C have the same configuration as the periodic pattern 40A, and the measuring marks 39B to 39D have the same configuration as the measuring mark 39A.

Figure 2C:
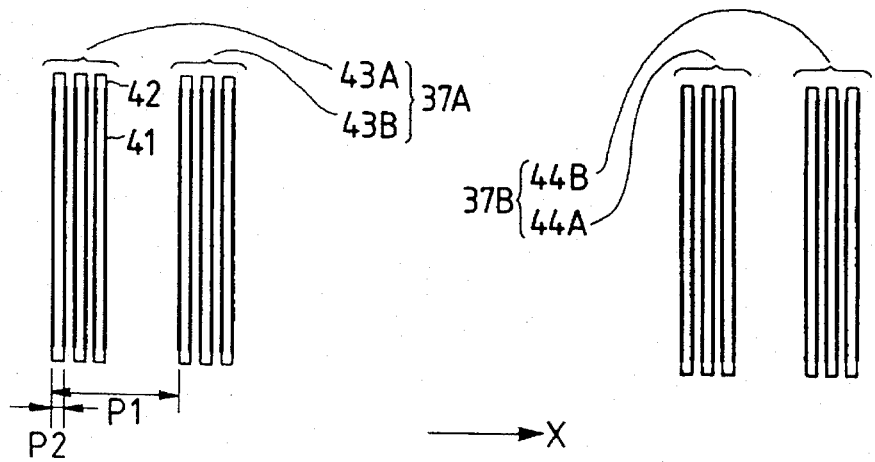
FIG. 2C is an enlarged view of the fiducial mark in FIG. 2A.

Further, one periodic pattern 37A which forms the fiducial mark 38 includes, as shown in FIG. 2C, two identical periodic patterns 43A, 43B arranged at a pitch P1 in the X-direction. The periodic pattern 43A is a line-and-space pattern formed at a pitch P2 so that an X-directional entire width is about one-half of P1. The phase shifters 42 are formed alternately in bright portions (light transmitting portions) thereof. The periodic pattern 43B also has the same configuration as the periodic pattern 43A. Further, the periodic pattern 37B consists of, the same way as the periodic pattern 37A, two periodic patterns 44A, 44B. The periodic patterns 44A, 44B have the same configuration as the periodic patterns 43A, 43B.

Figure 3A:
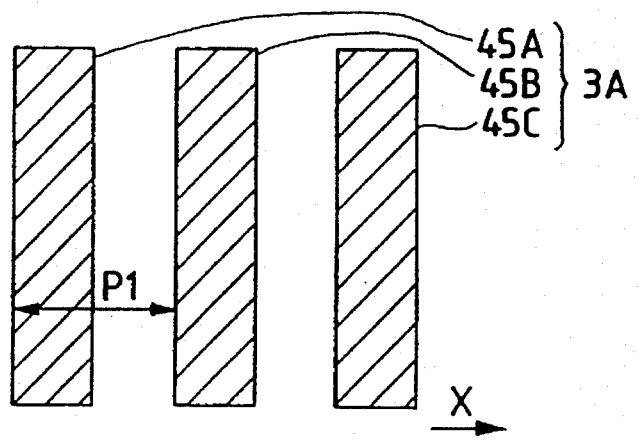
FIG. 3A is an enlarged view of a conventional measuring mark.
Figure 3B:
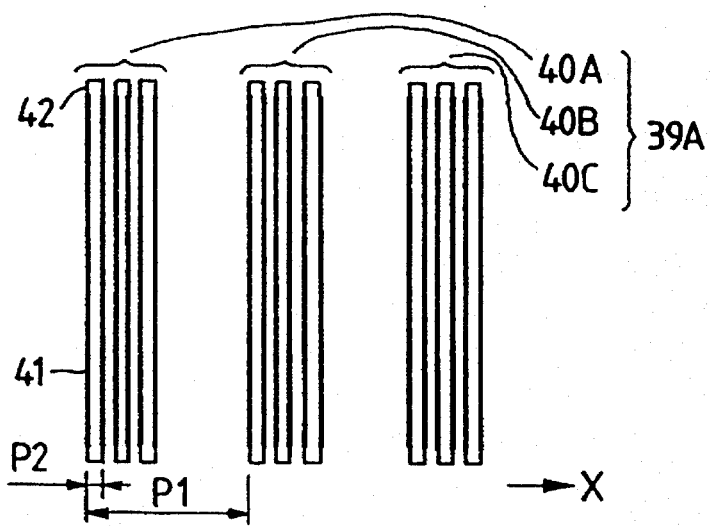
FIG. 3B is an enlarged view of the measuring mark in FIG. 2B.

The measuring mark 39A in FIG. 2B in this embodiment is shown as it is in FIG. 3B. FIG. 3A illustrates a conventional measuring mark corresponding thereto. Turning to FIG. 3A, the conventional measuring mark 3A includes light shielding patterns 45A to 45C arranged at the pitch P1 in the X-direction. As obvious from a comparison between FIGS. 3A and 3B, in the present embodiment, the light shielding patterns 45A to 45C of the conventional measuring mark 3A are replaced with the periodic patterns 40A to 40C of the measuring mark 39A. The pitch P1 of the conventional measuring mark 3A is on the order of 12 μm. The pitch P2 of each line-and-space pattern 41 of each of the periodic patterns 40A to 40C is 1 μm.

Given next is an explanation of a case where a distortion of the projection optical system 31 in FIG. 1 is measured by using the reticle 29 in FIG. 2A in contrast with the conventional example. Herein, a line width of an actual element pattern as a measuring object for the distortion of the projection optical system 31 is, it is assumed, 0.5 μm (pitch is 1 μm). Further, a wavelength of the exposure light IL is on the order of 365 nm (i-line of the mercury lamp), and a numerical aperture $NA_{iL}$ of the illumination optical system is 0.1. In this case, a diffraction angle $\theta 1$ of 1st-order diffraction light coming from the conventional measuring mark 3A in FIG. 3A is given as follows:

$$\sin \theta 1 = 0.365/12 = 0.030$$

Similarly, a diffraction angle θ2 of the 1st-order diffraction light from the measuring mark 39A in this embodiment in FIG. 3B is given by:

$$\sin θ2 = 0.365/1 = 0.365$$

Measured next is a distortion of the projection optical system 31 having a numerical aperture $NA_{PL}$ of 0.5 and a comatic aberration of 0.4 μm by use of the measuring mark 3A in FIG. 3A and the measuring mark 39A in FIG. 3B. The measuring method in this embodiment is basically the same as the conventional method except that the shape of each of the measuring and fiducial marks on the reticle are different. More specifically, only the fiducial mark 38 of FIG. 2A is exposed in four positions on the wafer. Thereafter, the measuring marks 39A to 39D are exposed in superposition on the wafer. Subsequently, resist patterns formed in four positions on the wafer by a developing process are sequentially detected. A positional deviation quantity of a measuring mark image from a fiducial mark image in the X-direction is thus obtained. Detected each as a single dark-line pattern at this time are images of the periodic patterns 40A to 40C of the measuring mark 39A in FIG. 2B and images of the periodic patterns 43A to 44B of the fiducial mark 38 in FIG. 2C in accordance with the present embodiment. A central position of the dark-line pattern is thereby obtained. Then, the distortion of the projection optical system is calculated from a plurality of positional deviation quantities.

Those images (resist patterns) can be measured through the wafer alignment system 34 in FIG. 1. Further, a resolving power of the wafer alignment system 34 may be approximately a value obtained by multiplying the pitch P1 in FIG. 2B by a projection magnification of the projection optical system 31. Hence, it follows that the resolving power of the wafer alignment system 34 may be approximately the conventional resolving power. The measurements thereof present the following results. A distortion is approximately 0 μm in the conventional measuring mark 3A. An X-directional distortion is ±0.15 μm in the measuring mark 39A in accordance with this embodiment. Note that if the number of measuring marks formed on the reticle in FIG. 2A increases, as a matter of course, an accuracy of measuring the distortion of the projection optical system can be enhanced.

Further, when a shift quantity of the image is calculated based on the comatic aberration on the order of 0.4 μm, the result obtained is that the shift quantity is 0.02 μm in the line-and-space pattern with a width of 6 μm, but is 0.18 μm in the line-and-space pattern with a width of 0.5 μm. Accordingly, it is confirmed that the distortion with respect to the actual element pattern having the width of 0.5 μm can be substantially precisely obtained by use of the measuring mark 39A in this embodiment.

In fact, when exposing the actual element pattern having the width of approximately 0.5 μm, an overlay error at the center of an exposure field of the projection optical system 31 is nearly 0 μm. However, an overlay error of +0.16 μm is seen in the X-direction as a result of measuring the distortion. This error is the same as the distortion component in terms of direction and quantity. It is considered that the error is derived from the distortion itself of the projection optical system 31. It can be also understood therefrom that the distortion relative to the actual element pattern can be obtained more accurately in this embodiment.

Figure 3C:
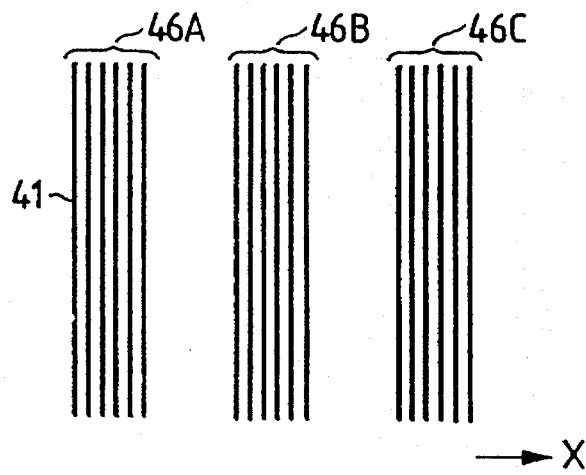
FIG. 3C is an enlarged view showing one example of a measuring mark suitable for a transform illuminant method.

In the case of the illuminating the reticle by the transform illuminant method, the measuring mark may involve the use of, as shown in FIG. 3C, periodic patterns 46A to 46C consisting of only line-and-space patterns 41 having no phase shifter and arranged at a predetermined pitch. Similarly, the fiducial mark may also involve the use of arranged periodic patterns consisting of only the line-and-space patterns. Further, when measuring the distortion by employing this measuring mark, the images of the respective periodic patterns 46A to 46C are each conceived as a single dark-line pattern, and the position is thus measured. The position can be thereby detected by use of the wafer alignment system 34, etc. in FIG. 1.

Next, there will be explained one example of the measuring mark in accordance with this embodiment which is suitable for the laser step alignment (LSA) method with reference to FIGS. 4A to 4C.

FIG. 4A illustrates a first measuring mark 47 suitable for the LSA method. The first measuring mark 47 in a light shielding portion 4 includes line-and-space patterns 47A, 47B, 47C, ... formed at a pitch P3 in the X-direction (measuring direction) and arranged at a predetermined spacing in the Y-direction. Further, an entire width of each of the line-and-space patterns 47A, 47B, ... is the same as L in the conventional example in FIG. 10A. Now, when the width L is set to 6 μm, the pitch P3 is on the order of 1 μm.

FIG. 4B depicts a second measuring mark 48 suitable for the LSA method. The second measuring mark 48 in a light shielding portion 6 includes line-and-space patterns 48A, 48B, 48C, ... formed at the pitch P3 in the X-direction and arranged at a predetermined spacing in the Y-direction. The entire width of each of the line-and-space patterns 48A, 48B, ... is also the same as L in the conventional example in FIG. 10B. Incidentally, it is assumed that the first measuring mark 47 is formed at the central portion on the reticle, and the second measuring mark 48 is formed at each of four corners.

The second measuring marks 48 are exposed in superposition on the wafer formed with latent images of the first measuring marks 47 of FIG. 4A in four positions in the same manner as the above-mentioned action of measuring the distortion by using the reticle in FIG. 2A. The wafer is thus developed, and then, as illustrated in FIG. 4C, a first measuring mark image 47P and a second measuring mark image 48P are formed in four positions on the wafer in a resist film 8. Then, as in the same way with the conventional example, the measuring mark images 47P, 48P are scanned in the X-direction with respect to a spot beam 9 of the wafer alignment system 35, thereby obtaining a positional deviation quantity Δx in the X-direction. Further, it follows that an X-directional distortion of the projection optical system is calculated from a deviation between this positional deviation quantity Δx and a design positional deviation quantity between the measuring mark images 47P, 48P.

Next, one example of the measuring mark suitable for a Moiré method in accordance with this embodiment will be explained with reference to FIGS. 5A to 5C.

Figure 5A:
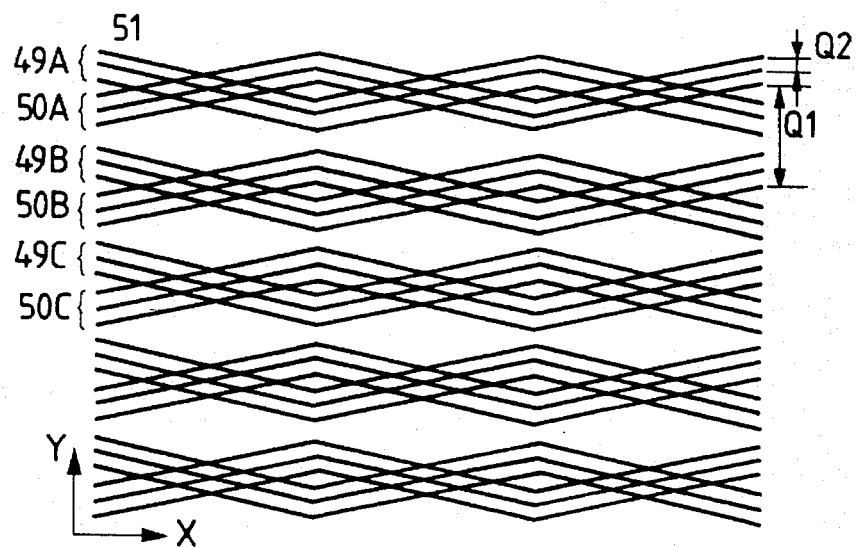
FIG. 5A is an enlarged view showing first and second measuring marks suitable for a Moiré method.
Figure 5B:
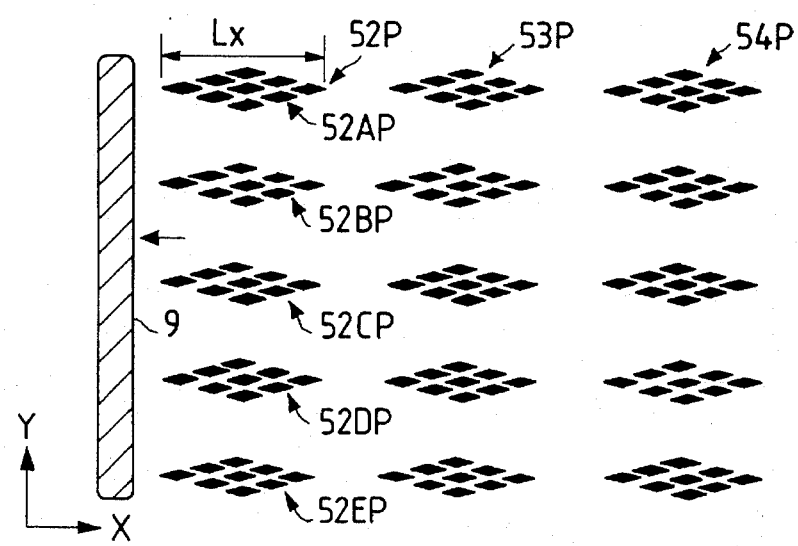
FIG. 5B is an enlarged view showing a resist image formed through the first and second measuring marks in FIG. 5A.
Figure 5C:
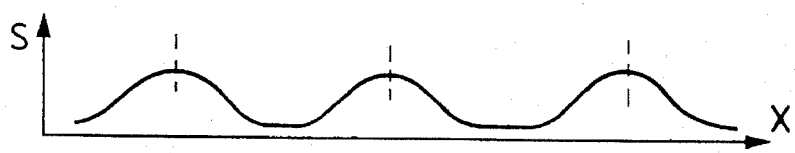
FIG. 5C is a view showing a detection signal obtained when detecting the image in FIG. 5B by the laser step alignment method.
Figure 11A:
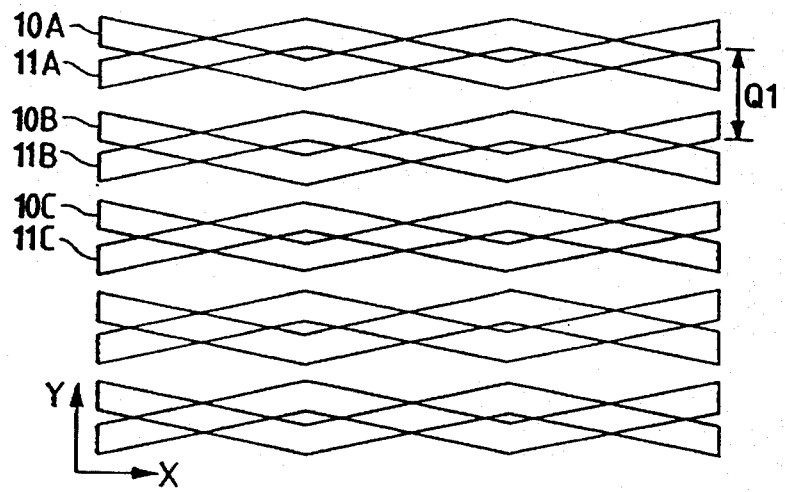
FIG. 11A is an enlarged view illustrating first and second measuring marks applied to the conventional Moiré method.
Figure 11B:
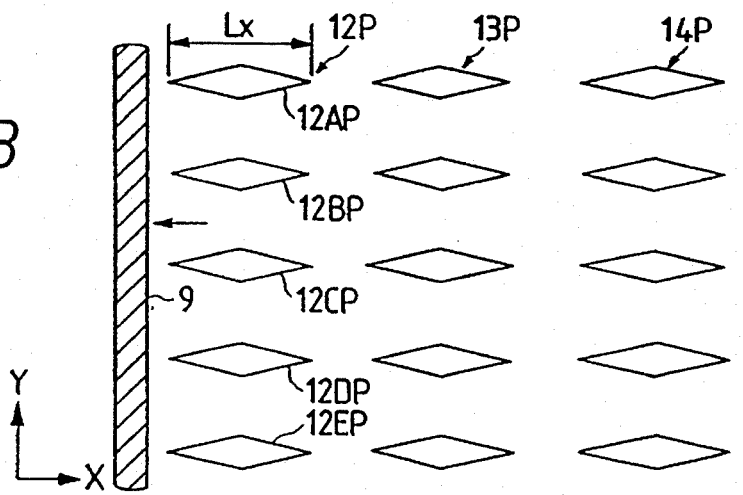
FIG. 11B is an enlarged view showing the resist image formed through the first and second measuring marks in FIG. 11A.
Figure 11C:
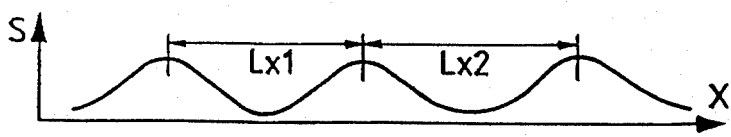
FIG. 11C is a view showing a photoelectric signal obtained when detecting the image in FIG. 11B by the laser step alignment method.
Figure 12A:
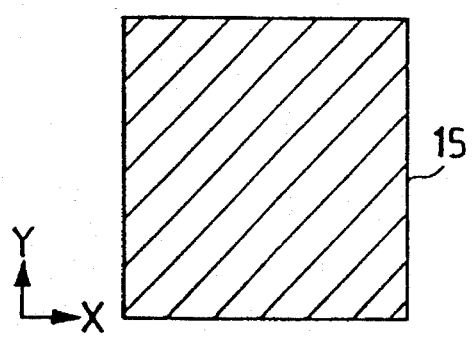
FIG. 12A is an enlarged view showing a first measuring mark applied to the conventional box-in-box method.
Figure 12B:
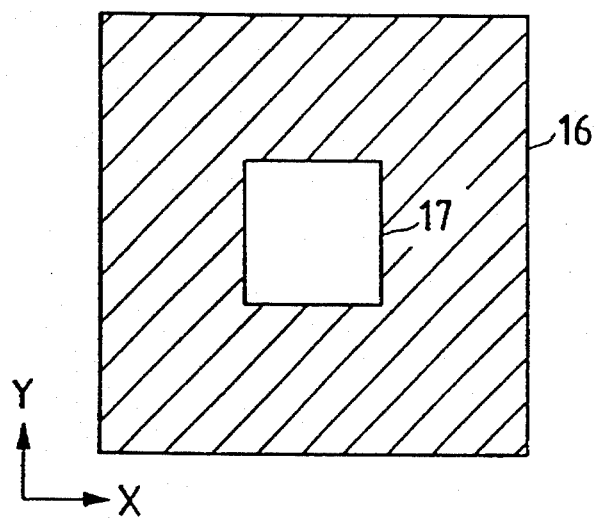
FIG. 12B is an enlarged view illustrating a second measuring mark applied to the conventional box-in-box method.
Figure 12C:
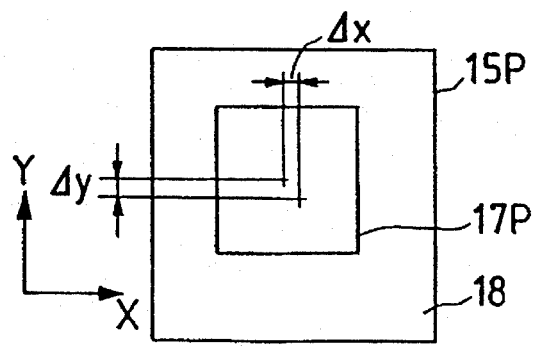
FIG. 12C is an enlarged view illustrating the resist image formed through the first and second measuring marks.
Figure 13A:
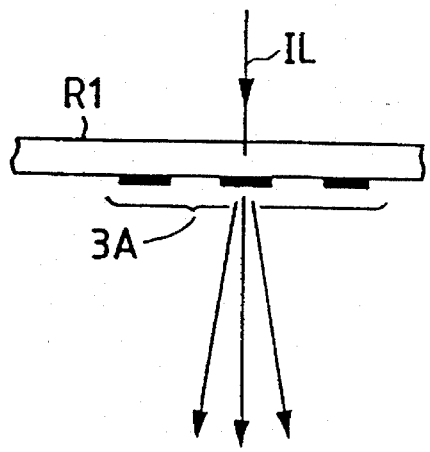
FIG. 13A is a view of a light path, showing beams of diffraction light from the conventional measuring mark.
Figure 13B:
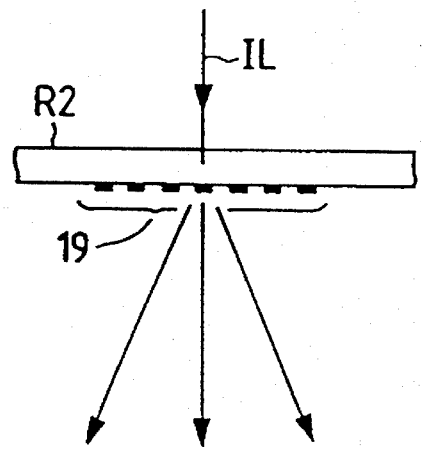
FIG. 13B is a view of a light path, showing the diffraction light from a conventional actual element pattern having a small pitch.
Figure 13C:
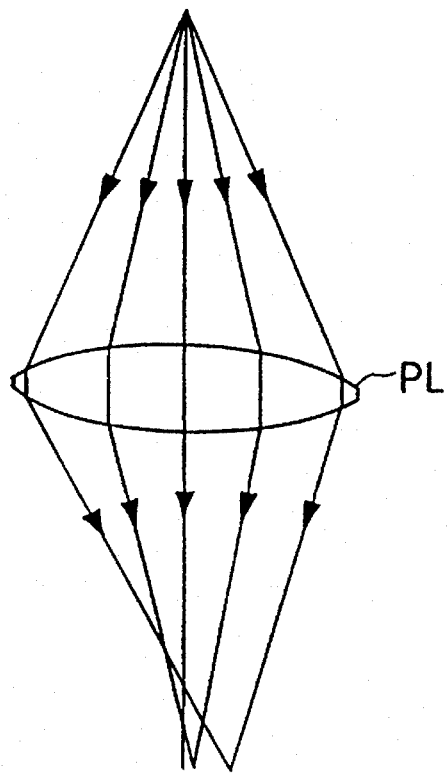
FIG. 13C is an explanatory view showing a comatic aberration of the projection optical system.
Figure 14A:
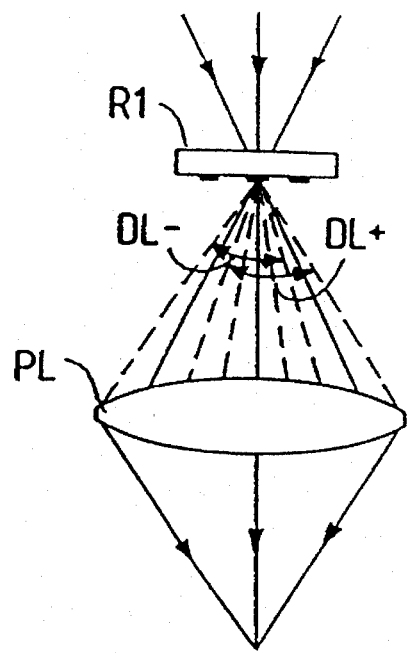
FIGS. 14A and 14B are views of light paths, each showing the diffraction light from the pattern when illuminating the reticle with the light by a normal illumination method.
Figure 14B:
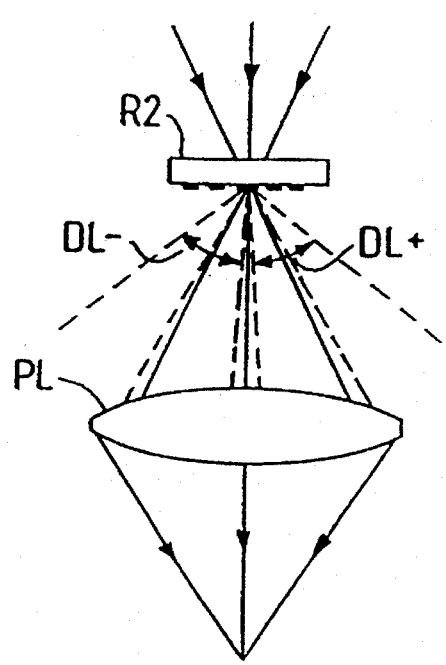
Figure 15A:
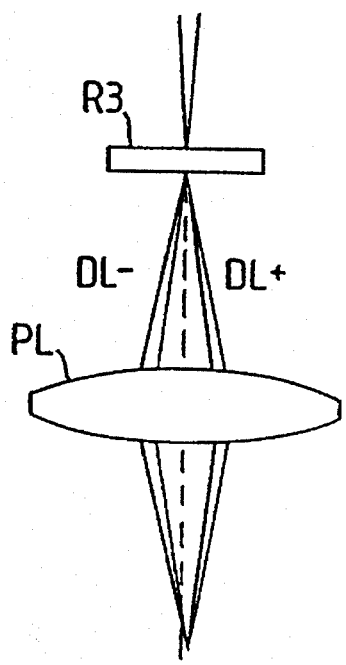
FIGS. 15A and 15B are views of light paths, each showing the diffraction light emitted from a phase-shift reticle.
Figure 15B:
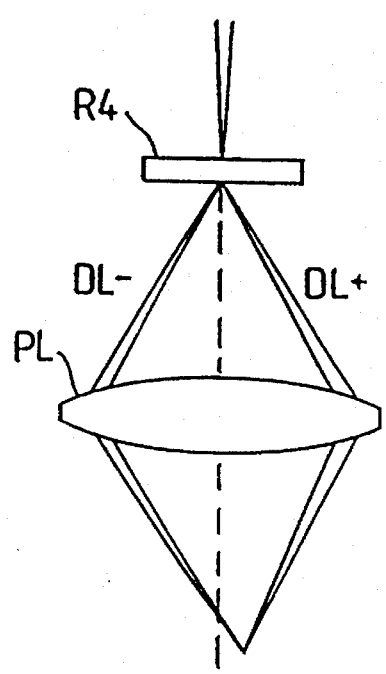

For an explanatory convenience, FIG. 5A illustrates first and second measuring marks in superposition which are suitable for the Moiré method in accordance with this embodiment. Actually however, first measuring marks 49A, 49B, 49C, ... are formed at the central portion on the reticle; and set of second measuring marks 50A, 50B, 50C, ... are formed at four corners. Paying attention to FIG. 5A, the first measuring marks are configured such that periodic patterns 49A, 49B, 49C, ... each consist of three triangular waveform dark-line patterns arranged at a pitch Q2 in the Y-direction (measuring direction), and these patterns 49A, 49B, 49C, ... are arranged at a pitch Q1 in the Y-direction. The pitch Q1 of the periodic patterns 49A, 49B, 49C, ... is equal to the pitch Q1 in the conventional example shown in FIG. 11A. The pitch Q2 of the respective periodic patterns 49A, 49B, 49C, ... is equal to the pitch of the actual element pattern and can be set up to, e.g., approximately 1 μm. Similarly, the second measuring marks are configured such that periodic patterns 50A, 50B, 50C, . . . each consist of three triangular waveform dark-line patterns arranged at the pitch Q2 in the Y-direction, and these patterns 50A, 50B, 50C, . . . are arranged at the pitch Q1 in the Y-direction.

In the same way as with the above reticle 29 in FIG. 2A, the second measuring marks 50A, 50B, . . . are exposed in superposition on the wafer formed with latent images of the first measuring marks 49A, 49B, . . . of FIG. 5A in four positions. The wafer is thus developed. Then, as illustrated in FIG. 5B, an overlaid image 52P composed of resist patterns 52AP to 52EP distributed in rhombic shapes and overlaid images 53P, 54P each assuming the same configuration as this overlaid image 52P but shifted in the X-direction are formed in the four positions respectively on the wafer. Then, if an X-directional length Lx of the overlaid image 52P is measured, as done the same with the conventional example, the overlaid images 52P to 54P may be scanned in the X-direction with respect to the spot beam 9 of the wafer alignment system 35. With this scanning, as shown in FIG. 5C, detection signals corresponding to profiles of the overlaid images 52P to 54P are obtained. Hence, The X-directional length Lx thereof is easily obtained. Spacings therebetween are acquired from the respective X-directional positions of the overlaid images 52P to 54P. A positional deviation quantity in the Y-direction between the first measuring mark image and the second measuring mark image is calculated based on these spacings. Then, a Y-directional distortion of the projection optical system can be calculated at a high accuracy from the Y-directional positional deviation quantity in each of the four positions on the wafer.

Figure 6A:
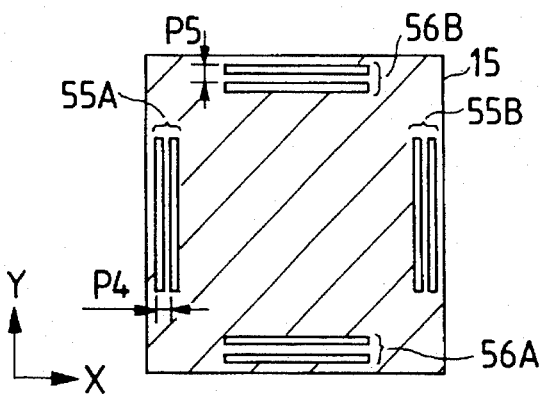
FIG. 6A is an enlarged view illustrating a first measuring mark suitable for a box-in-box method.
Figure 6B:
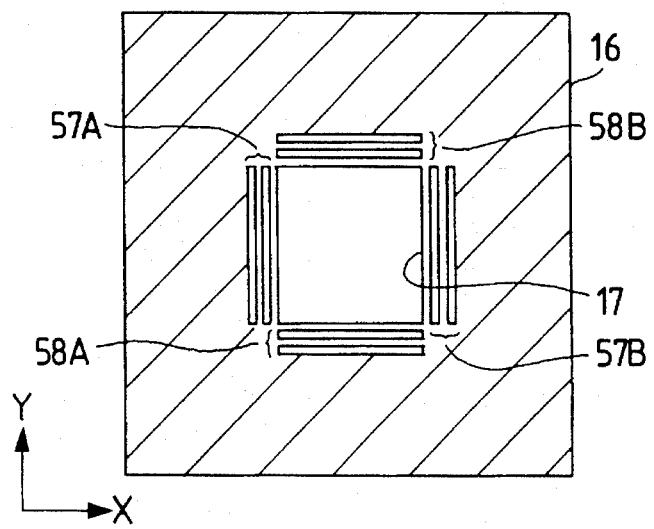
FIG. 6B is an enlarged view showing a second measuring mark suitable for the box-in-box method.
Figure 6C:
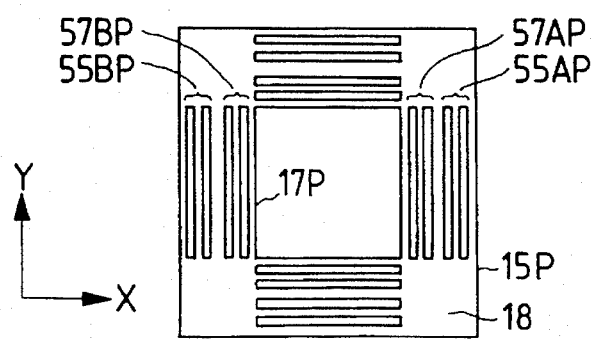
FIG. 6C is an enlarged view showing a resist image formed through the first and second measuring marks in FIGS. 6A and 6B.
Figure 7:
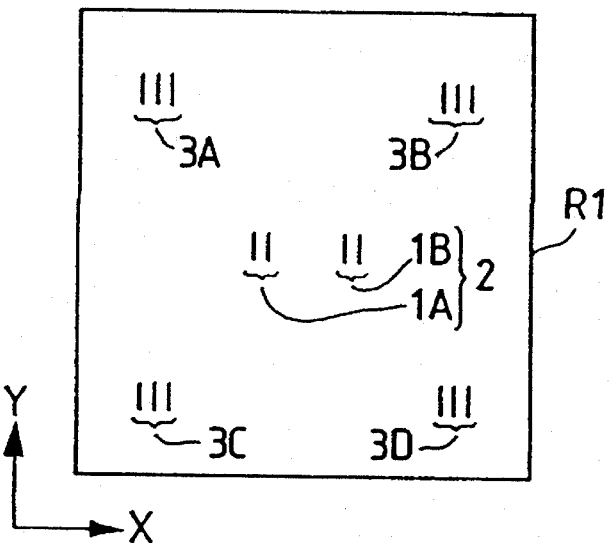
FIG. 7 is a view showing a configuration of a conventional reticle for measuring a distortion.
Figure 8A:
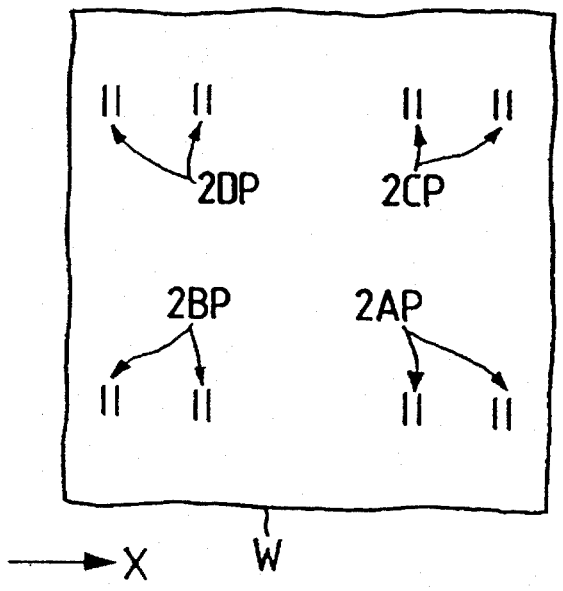
FIG. 8A is a view showing how a fiducial mark image is formed on a wafer.
Figure 8B:
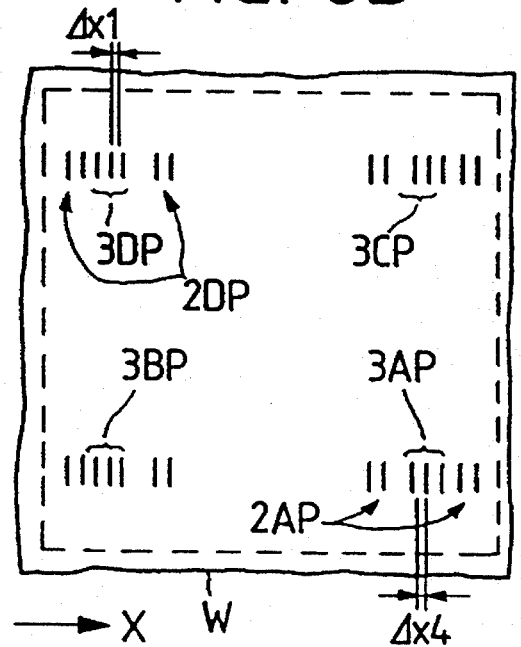
FIG. 8B is a view showing how the measuring mark image is formed on the wafer in FIG. 8A.
Figure 9A:
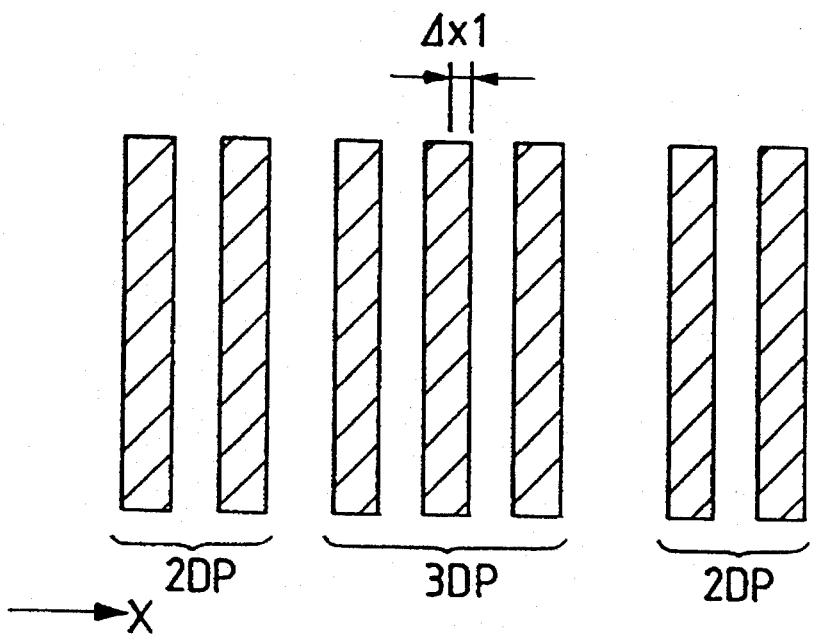
FIG. 9A is an enlarged view illustrating a fiducial mark image and measuring mark image in the prior art.
Figure 9B:
FIG. 9B is an enlarged view illustrating how a pitch of the mark is reduced in the prior art.

Given next is one example of the measuring mark suitable for a box-in-box method in accordance with this embodiment with reference to FIGS. 6A to 6C.

FIG. 6A depicts a first measuring mark 15 by the box-in-box method in this embodiment. Referring to FIG. 6A, the first measuring mark 15 is configured such that line-and-space patterns 55A, 55B having a pitch P4 are formed on X-directional fringes of a square light shielding pattern (oblique-lined portion); and line-and-space patterns 56A, 56B having a pitch P5 are formed on Y-directional fringes thereof. The pitches P4, P5 can be each set up to approximately 1 μm.

FIG. 6B illustrates a second measuring mark 16 by the box-in-box method in accordance with this embodiment. Paying attention to FIG. 6B, the second measuring mark 16 fundamentally takes such a configuration that a square aperture (light transmitting) pattern 17 is formed within the square light shielding pattern (oblique-lined portion). In FIG. 6B, however, line-and-space patterns 57A, 57B having the pitch P4 are formed in the X-direction on the light shielding portion in close proximity to the aperture pattern 17. Line-and-space patterns 58A, 58B having the pitch P5 are likewise formed thereon in the Y-direction. Incidentally, it is assumed that the first measuring mark 15 is formed at the central portion on the reticle, and second measuring mark 16 is formed at each of four corners.

Now, the same as with the above-mentioned reticle in FIG. 2A, the second measuring marks 16 are exposed in superposition on the wafer formed with the latent images of the first measuring marks 15 of FIG. 6A in the four positions. The wafer is thus developed. Then, as shown in FIG. 6C, first measuring mark images 15P and aperture pattern images 17P of the second measuring marks 16 are formed in the four positions respectively on the wafer. Formed further in the X-direction are images 55AP, 55BP of the line-and-space patterns 55A, 55B and images 57BP, 57AP of the line-and-space patterns 57A, 57B. The images are also formed the same in the Y-direction. Accordingly, these images undergo an aberration to the same degree as the actual element pattern having the pitch of 1 μm. The X- and Y-directional distortions can be therefore measured by measuring the X- and Y-directional positional deviation quantities in FIG. 6C.

In the first embodiment discussed above, the double exposures are effected on the wafer by use of the first and second measuring marks on the reticle. The resist patterns formed on the wafer after being developed are detected, thereby obtaining the imaging characteristics. However, the latent images formed in the resist on the wafer may be detected without performing the developing process. Further, a substrate coated with, e.g., a thermoplastic resin is employed as a photosensitive substrate. Latent images formed on the substrate may also be detected. In addition, projected images of the measuring marks when irradiating the reticle with the exposure light may also be directly detected by using an imaging device (CCD, etc.) provided on the wafer stage 32. For instance, the fiducial mark 38 (FIG. 2C) is formed on a mark plate 118 on a wafer stage 110 in FIG. 16. At the same time, a magnifying optical system and the imaging device are disposed under the mark plate. Then, the mark plate 118 is positioned in a projecting position (design value) of the measuring mark 39A on the reticle 29. The reticle is irradiated with the exposure light, thereby forming a projected image on the mark plate 118. Further, the light passing through the mark plate 118 is led via the magnifying optical system to the imaging device. The projected images of the fiducial mark 38 and the measuring mark 39A are again formed on the light receiving surface thereof. An X-directional positional deviation quantity between these two images is detected based on image signals given from the imaging device. The same measurement is conducted with respect to the remaining measuring marks 39B to 39D. The X-directional distortion of the projection optical system can be thereby calculated as done the same with the embodiment discussed above. At this time, the fiducial mark on the mark plate 118 is not necessarily configured as shown in FIG. 2C but may be a light shielding pattern as used to be.

Next, a second embodiment of the present invention will be described with reference to FIGS. 16 to 20. The second embodiment presents an arrangement where this invention is applied to a measurement of a comatic aberration of the projection optical system in the projection exposure apparatus.

Figure 16:
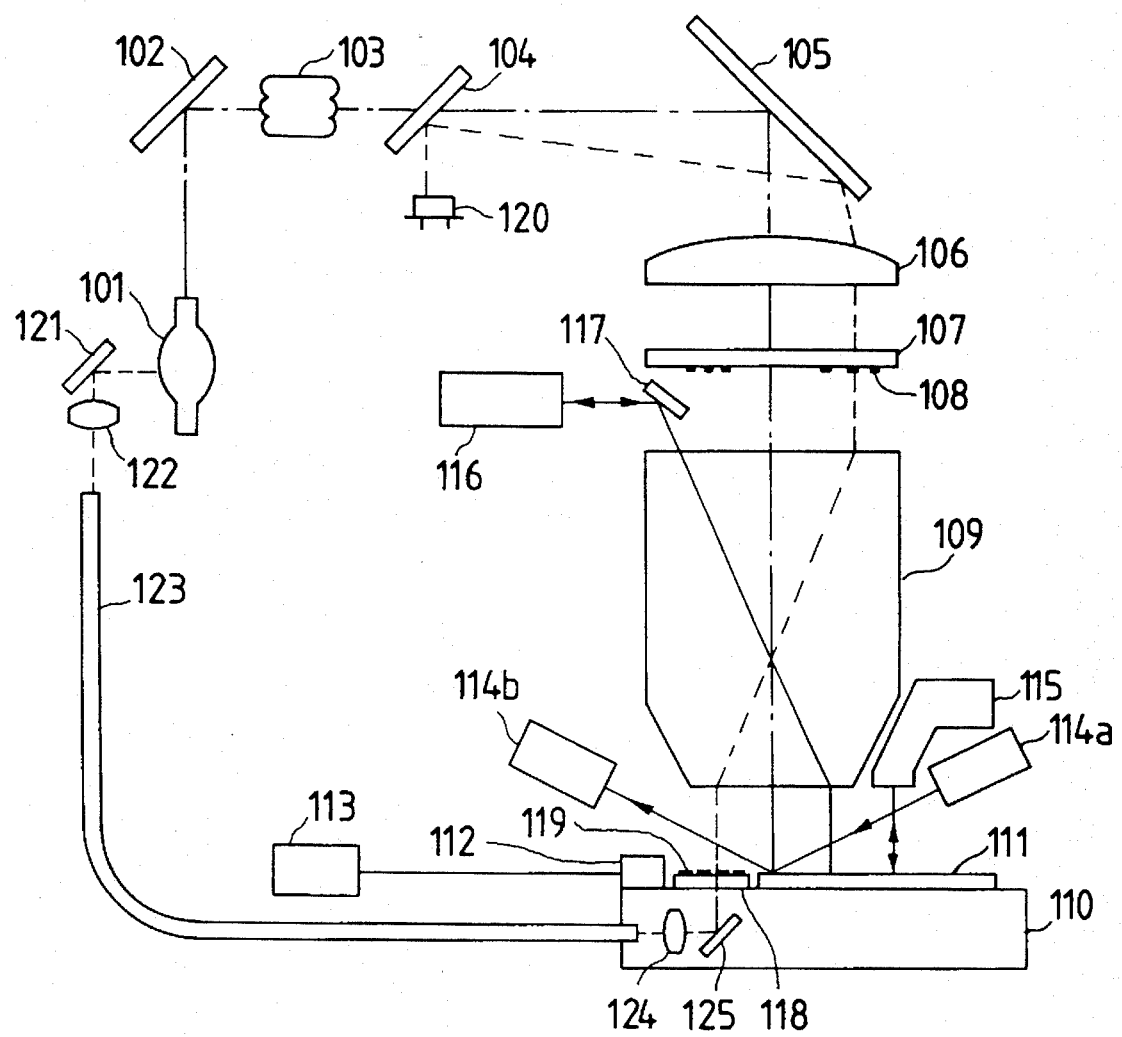
FIG. 16 is a view illustrating a construction of a projection exposure apparatus employed in a second embodiment in the present invention.

FIG. 16 schematically illustrates a construction of the projection exposure apparatus employed in this embodiment. Referring to FIG. 16, a beam of exposure light emitted from a super-high-pressure mercury lamp (or an excimer laser light source) 101 is reflected by a mirror 102. The exposure light thereafter falls on a fly-eye lens 103 via an unillustrated input lens. A multiplicity of secondary illuminants are formed on a rear-side (reticle-side) focal plane of the fly-eye lens 103. A reticle is illuminated with beams of exposure light outgoing from these secondary illuminants with an uniform illuminance via a beam splitter 104, a mirror 105 and a condenser lens 106. A relay lens system and a reticle blind are, though not shown, disposed between the fly-eye lens 103 and the condenser lens 106 in the same way with the first embodiment (FIG. 1). This reticle blind sets an illumination area on the reticle 107.

An image of a pattern 108 formed on the lower surface of the reticle 107 is reduced by a factor of 5 through a projection optical system 109 and then transferred on a wafer 111 placed on a wafer stage 110. A resist is coated on the wafer 111. Further, the rear-side focal plane of the fly-eye lens 103 in the illumination optical system is substantially conjugate with a pupil plane of the projection optical system 109. The wafer stage 110 is so constructed as to be two-dimensionally movable by an unillustrated motor within a plane perpendicular to the optical axis of the projection optical system 109. The wafer stage 110 is also so constructed as to be capable of making micromotions along the optical axis of the projection optical system 109. Further, rectangular coordinates of the plane perpendicular to the optical axis of the projection optical system 109 are expressed by X- and Y-axes. A movable mirror 112 having reflecting surfaces perpendicular to the X- and Y-directions is provided above the wafer stage 110. This movable mirror 112 is irradiated with two laser beams orthogonal to each other, which come from a laser interferometer 113. Thus, the laser interferometer 113 always measures the X- and Y-coordinates of the wafer stage 110.

Provided further in this embodiment are oblique incident light type auto-focus systems 114a, 114b for detecting a position (focus position) of the surface of the wafer 111 or a fiducial mark plate 118 which will be mentioned later. The auto-focus systems 114a, 114b are, as disclosed in, e.g., U.S. Pat. No. 4,650,983, constructed of a light sending system 14a for projecting a slit pattern image on the wafer surface obliquely to the optical axis of the projection optical system 109 and a light receiving system 14b for reforming the slit pattern image by receiving the reflected light from the wafer surface. Accordingly, when the focus position of the wafer 111, changes a position of the slit pattern image to be re-formed changes. The change in the focus position can be therefore detected. The light receiving system 14b incorporates a photoelectric detector for generating a focus signal which varies corresponding to the position of the slit pattern image re-formed. Micromotions of the wafer stage 110 in the optical-axis directions are made to keep the focus signal at a predetermined level. The focus position of the surface of the wafer 111 or the fiducial mark plate 118 can be thereby kept in a predetermined position. Note that a wafer alignment system 115 by the off-axis method and a laser step alignment (LSA) system 116 by the TTL method are constructed absolutely the same as the wafer alignment system 34 and the LSA system 35 of FIG. 1, and, therefore, their explanations will be omitted herein.

The fiducial mark plate 118 formed with a predetermined fiducial mark 119 is mounted in the vicinity of the wafer 111 on the wafer stage 110. Provided further is a photoelectric converting element 120 for receiving, via a beam splitter 104, the light generated from the fiducial mark plate 118 and passing through the projection optical system 109 and the reticle 107. The photoelectric converting element 120 is so disposed that a light receiving surface thereof is substantially conjugate with the pupil plane of the projection optical system 109. Then, when the fiducial mark plate 118 exists in an exposure field of the projection optical system 109, the exposure light from the light source 101 is converged at one end of a light guide 123 through a mirror 121 and a condenser lens 122. The exposure light emerging from the other end of the light guide 123 falls on a fiducial mark plate 118 via a condenser lens 124 and a mirror 125. The exposure light penetrating a fiducial mark 119 is incident on the light receiving surface of the photoelectric converting element 120 through the projection optical system 109, the pattern 108 on the reticle 107, the condenser lens 106, the mirror 105 and the beam splitter 104. The photoelectric converting element 120 outputs a detection signal corresponding to an overlaid state of the reticle pattern 108 on the projected image of the fiducial mark 119. Based on this detection signal and a measured value of the laser interferometer 113, it is possible to obtain coordinate values of the wafer stage 110, or in other terms, coordinate positions of the measuring mark on the reticle 107 in the rectangular coordinate system XY when the projected image of the fiducial mark 119 coincides with a predetermined measuring mark on the reticle 107. This type of mark detection system is disclosed in, e.g., U.S. Pat. No. 4,853,745. Note that the fiducial mark plate 118 in FIG. 16 is not used in this embodiment. Further, though not illustrated in FIG. 16, it is assumed that there is provided the main control system MCS for exercising general control over the operation of the whole projection exposure apparatus as was shown in FIG. 1.

Next, there will be explained one example of the operation in the case of obtaining a comatic aberration of the projection optical system 109 in this embodiment.

Figure 17A:
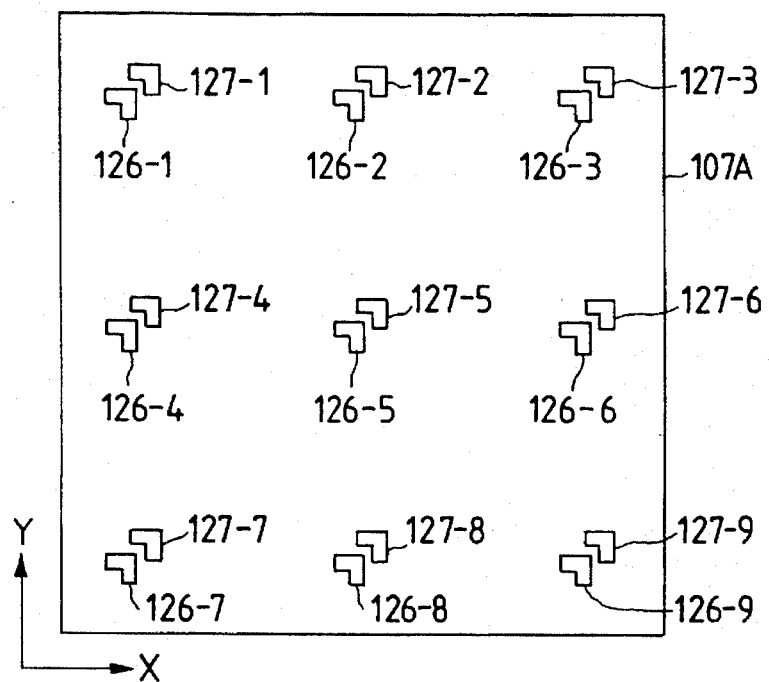
FIG. 17A is a view showing a reticle pattern used in the second embodiment of this invention.
Figure 17B:
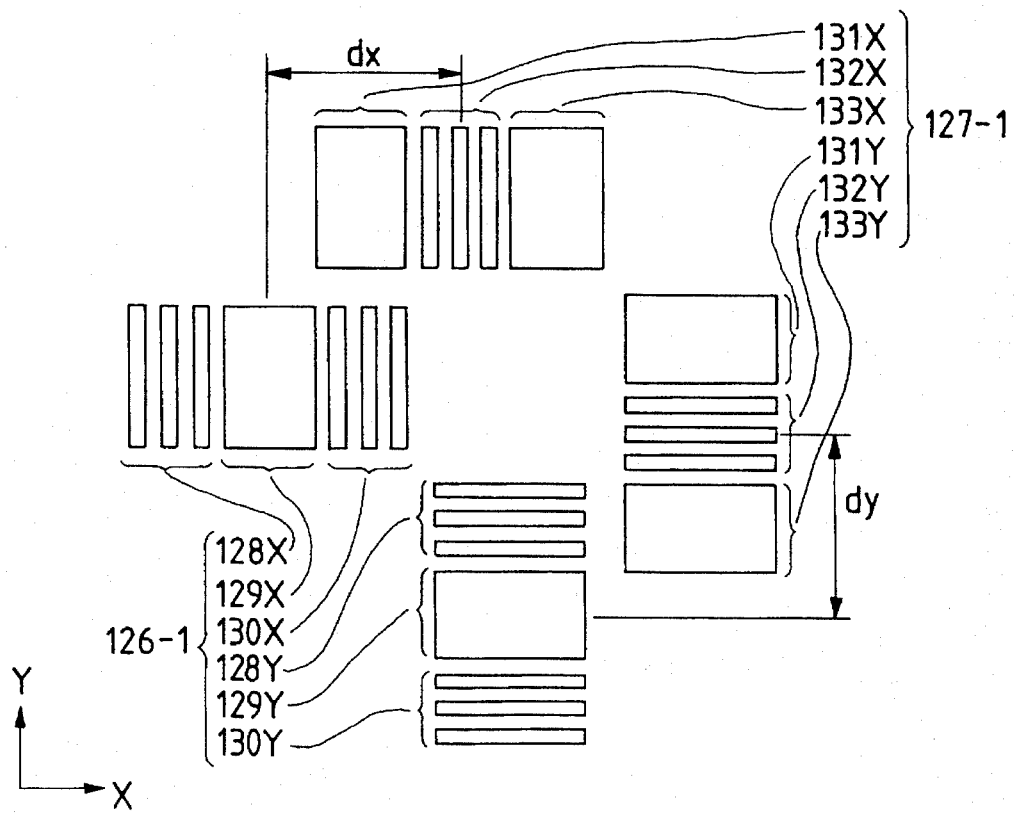
FIG. 17B is an enlarged view illustrating a main scale mark and vernier mark in FIG. 17A.

FIG. 17A illustrates a specific configuration of a reticle 107A used in this embodiment. Referring to FIG. 17A, main scale marks 126-1, 126-2, . . . , 126-9 taking the same shape are formed in nine positions on the pattern forming surface of the reticle 107A. Vernier marks 127-1, 127-2, . . . 127-9 taking the same shape are so formed so that the centers thereof are positioned in positions deviating by dx in the X-direction and dy in the Y-direction from the centers of the respective main scale marks. The main scale mark 126-1, as illustrated in FIG. 17B, consists of sets of X- and Y-directional marks. The X-directional marks include line-and-space patterns (hereinafter called [L/S patterns]) 128X, 130X, wherein light shielding portions and light transmitting portions each having a width of 6 µm are alternately arranged in the X-direction with a light shielding portion 129X being interposed therebetween. The Y-directional marks include L/S patterns 128Y, 130Y, wherein the light shielding portions and light transmitting portions each having the width of 6 µm are alternately arranged in the Y-direction with a light shielding portion 129Y being interposed therebetween.

Additionally, each of the vernier marks 127-1, 127-2 consists of sets of X- and Y-directional marks. The X-directional marks include light shielding portions 131X, 133X disposed in the X-direction, with L/S patterns 132X each having a width of 6 µm and being interposed therebetween. The Y-directional marks include light shielding portions 131Y, 133Y disposed in the Y-direction, with the L/S patterns 132Y each having the width of 6 µm and being interposed therebetween. In this case, when the main scale mark 126-1 is shifted by dx in the X-direction and dy in the Y-direction, the light shielding portions 129X, 129Y are superposed respectively on the L/S patterns 132X, 132Y of the vernier mark 127-1. At the same time, the L/S patterns 128X, 130X, 128Y, 130Y are superposed on the light shielding portions 131X, 133X, 131Y, 133Y of the vernier mark 127-1.

The reticle 107A in FIG. 17A is mounted as the reticle 107 in FIG. 16. An asymmetric aberration of the projection optical system 109 is then measured by the following steps.

[First Step]

Figure 18A:
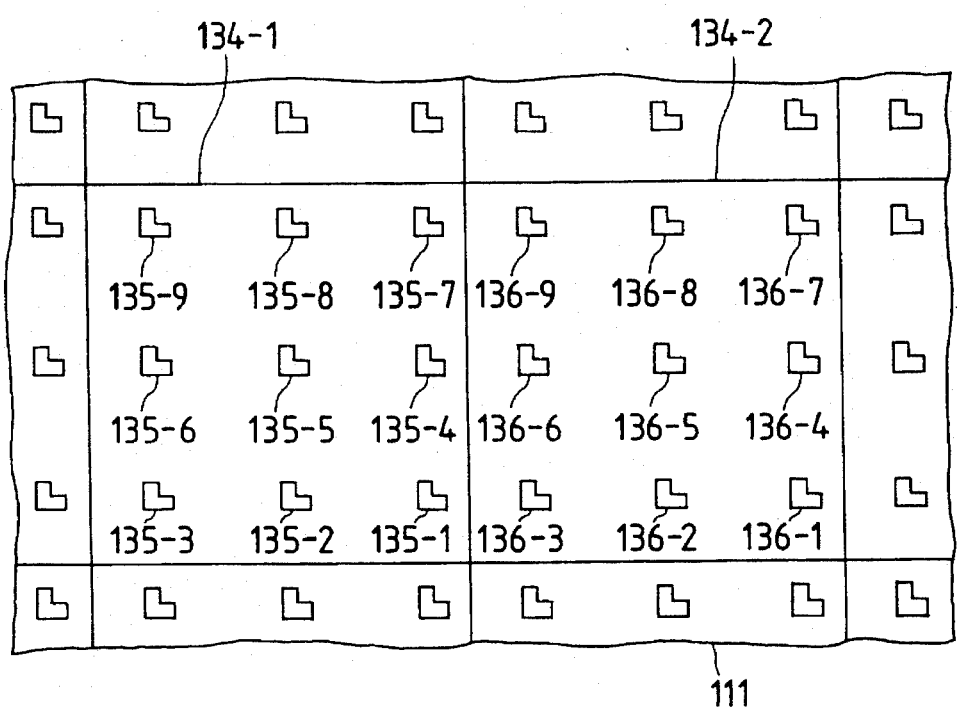
FIG. 18A is an enlarged view illustrating a plurality of shot areas on the wafer.

The position on the surface, i.e., the focus position, of the wafer 111 in the optical-axis direction of the projection optical system 109 is set in a best imaging surface position (best focus position) of the projection optical system 109 or in the vicinity thereof. In this state, the wafer stage 110 is driven. Images on the reticle 107A, more specifically, of the main scale marks 126-1 through 126-9 in FIG. 17A are exposed respectively in a multiplicity of shot areas on the wafer 111. With this exposure, as illustrated in FIG. 18A, the images of the main scale marks 126-1 through 126-9 are exposed in measuring subareas 135-1 through 135-9 within the shot area 134-1 and measuring subareas 136-1 through 136-9 within the shot area 134-2 and respective measuring subareas within other shot areas on the wafer 111. Relative positions of the measuring subareas 135-1 through 135-9 within the shot area 134-1 are identical with relative positions of the measuring subareas 136-1 through 136-9 within the shot area 134-2.

[Second Step]

Images of vernier marks 127-1 to 127-9 in FIG. 17A are overlay-exposed respectively in the shot areas 134-1, 134-2 and other shot areas on the wafer 111 in FIG. 18A while shifting the focus position of the wafer 111. The focus position is shifted at an interval of 0.5 μm in a range of −3 μm to +3 μm with the best focus position being centered. Further, when performing the overlay-exposure in each shot area, the position of the wafer 111 is shifted by dx/5 in the X-direction but dy/5 in the Y-direction, thus effecting the exposure. Images of the vernier marks 127-1 to 127-9 in FIG. 17A are thereby overlay-exposed in the measuring subareas 135-1 to 135-9 of the shot area 134-1, the measuring subareas 136-1 to 136-9 of the shot area 134-2 and the respective measuring subareas of other shot areas on the wafer 111 in FIG. 18A.

Figure 18B:
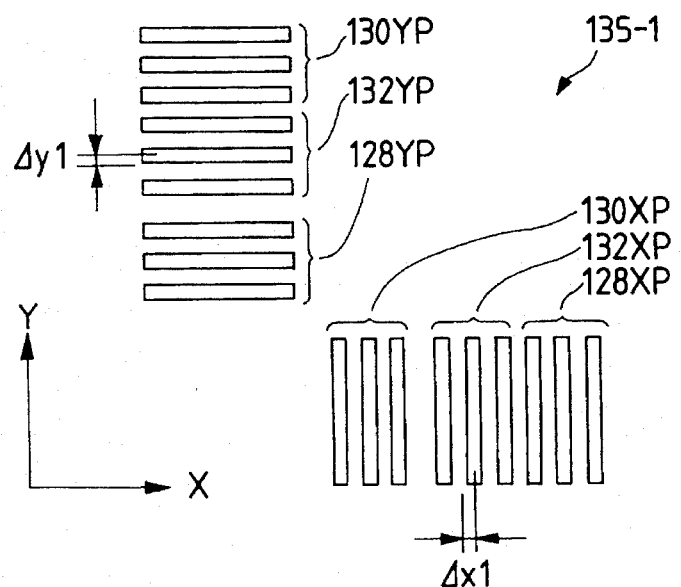
FIG. 18B is an enlarged view illustrating a pair of images of the main scale and vernier marks in FIG. 18A.

FIG. 18B illustrates latent images formed by the double exposure with respect to the measuring subarea 135-1 in FIG. 18A. Turning to FIG. 18B, an image 132XP of an L/S pattern 132X of the vernier pattern 127-1 is exposed between an image 128XP of an L/S pattern 128X of the main scale pattern 126-1 and an image 130XP of an L/S pattern 130X in FIG. 17B. Similarly, an image 132YP of an L/S pattern 132Y of the vernier pattern 127-1 is exposed between an image 128YP of an L/S pattern 128Y of the main scale pattern 126-1 and an image 130YP of an L/S pattern 130Y. In this case, the X-directional central position of the L/S pattern image 132XP of the vernier pattern deviates by Δx1 from the X-directional central position of the L/S pattern images 128XP, 130XP of the main scale pattern due to a decline of a telecentric property and the comatic aberration of the projection optical system 109. The Y-directional central position of the L/S pattern image 132YP of the vernier pattern deviates by Δy1 from the Y-directional central position of the L/S pattern images 128YP, 130YP of the main scale pattern.

Further, the image of the vernier pattern deviates from the image of the main scale pattern in the X- and Y-directions also in other measuring subareas 135-2 to 135-9 in FIG. 18A. Similarly, the image of the vernier pattern deviates from the image of the main scale pattern in the X- and Y-directions corresponding to the decline of the telecentric property and the comatic aberration of the projection optical system 109 also in the measuring subareas 136-1 to 136-9 of the adjacent shot area 134-2 and the measuring subareas of other shot areas.

[Third Step]

The wafer 111 undergoing the double exposure in the first and second steps is developed. The position of the resist pattern formed on the wafer 111 is measured by the wafer alignment system 115 in FIG. 16. For example, a relative positional difference Px defined as an X-directional deviation quantity of the image of the vernier pattern from the image of the main scale pattern is measured in the first measuring subarea 135-1 of the shot area 134-1, the first measuring subarea 136-1 of the shot area 134-2 and the first measuring subareas of other shot areas in FIG. 18A. Further, a relative positional difference Py defined as a Y-directional deviation quantity of the image of the vernier pattern from the image of the main scale pattern in the first measuring subareas 135-1, 136-1 and the first measuring subareas of other shot areas. Measured similarly are X- and Y-directional relative positional differences Px, Py of the images of the vernier patterns from the images of the main scale patterns in the respective focus positions also in measuring subareas.

[Fourth step]

Figure 19:
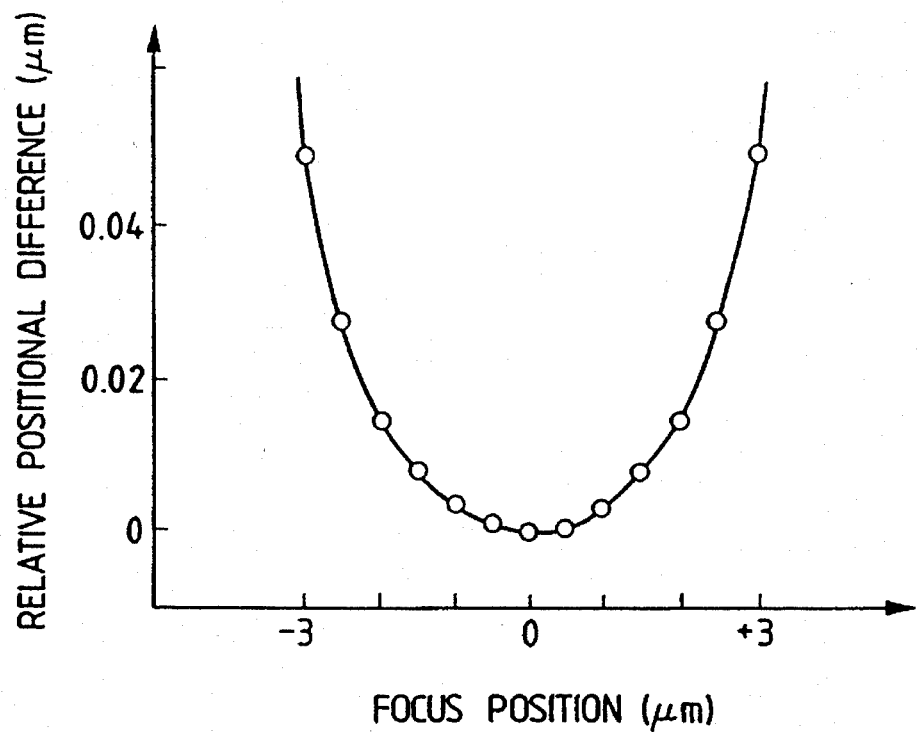
FIG. 19 is a view showing a relationship between a focus position and a relative positional difference in the second embodiment.
Figure 20:
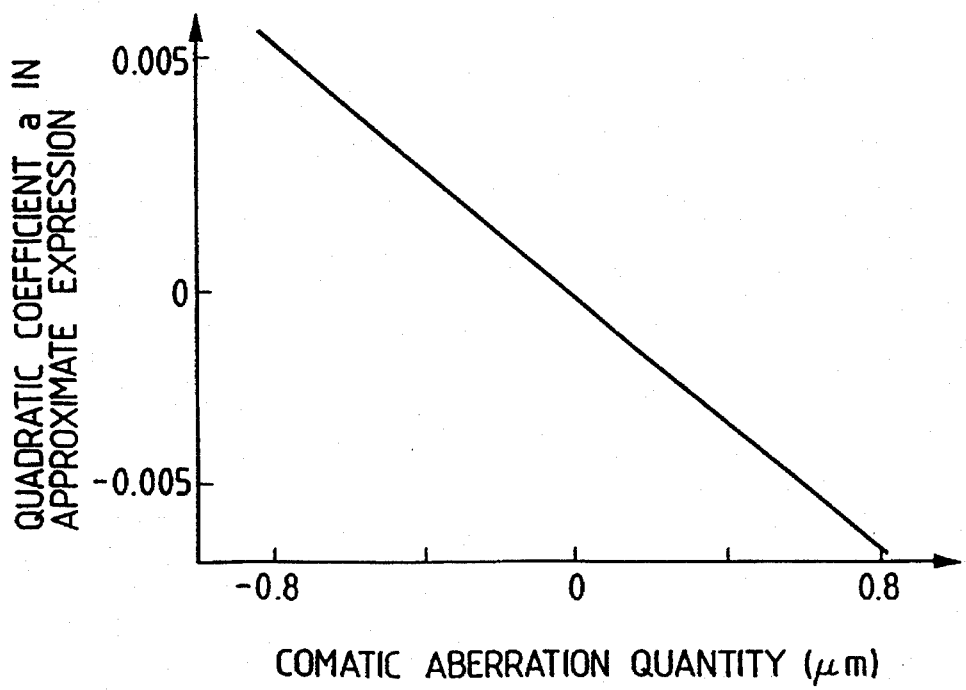
FIG. 20 is a view showing a relationship between a coefficient a of a square term in an approximate expression and a comatic aberration quantity in the second embodiment.

For instance, when plotting, in a focus position F, the X-directional relative positional differences Px measured in the first measuring subareas 135-1, 136-1 and the first measuring subareas of other shot areas, a quadratic curve is obtained as shown in FIG. 19. Now, there is presumed a quadratic function P1 (F) of the focus positions F expressed by coefficients a, b, c. Obtained by, e.G., the least squares method are the coefficients a, b, c when the relative positional difference Px is best approximated as follows:

$$Px = P1(F) = aF^2 + bF + c \qquad (1)$$

Obtained beforehand by the calculation in this case is a relationship between the coefficient a of the square term of the quadratic function P1 (F) and an X-directional comatic aberration quantity of the projection optical system 109 in the measuring subarea 135-1. This relationship becomes as shown in, e.g., FIG. 20. It is therefore possible to acquire the X-directional comatic aberration quantity of the projection optical system 109 in the measuring subarea 135-1 by applying the coefficient a obtained by the above approximation to this relationship. It is also feasible to obtain the Y-directional comatic aberration quantity of the projection optical system 109 in the measuring subarea 135-1 from a relationship between the previously obtained comatic aberration quantity and the coefficient of the square term when the Y-directional relative positional difference Py measured in each of the measuring subareas 135-1, 136-1, . . . is approximated by the quadratic function of the focus position F. Similarly, the X- and Y-directional comatic aberration quantities of the projection optical system 109 in the remaining measuring subareas 135-2 to 135-9 in FIG. 18A can be obtained from the relationship acquired beforehand and the relative positional difference as well.

In this way, according to the present embodiment, the relative positional difference between the position of the main scale pattern image and the vernier pattern image on the wafer 111 is measured by the wafer alignment system 115. It is thereby possible to quickly obtain the X- and Y-directional comatic aberration quantities of the projection optical system 109 in the multiplicity of measuring subareas without employing a high-accuracy measuring apparatus such as a scan type electronic microscope (SEM). Accordingly, even when increasing the number of the measuring subareas 135-1 to 135-9 shown in FIG. 18A, the comatic aberration quantities of the projection optical system 109 in the respective measuring subareas can be obtained in a comparatively short time.

Further, the comatic aberration quantity is obtained only from the coefficient a of the square term of the quadratic function P1 (F), i.e., a symmetric component with respect to the focus position F in this embodiment. A value of the coefficient c of the constant term of the quadratic function P1 (F) is not therefore influenced by the measured result of the comatic aberration quantity. Accordingly, even if the value of the coefficient c varies due to, e.g., an approximately 0.5 μm deviation of the wafer 111 from the best focus position during the exposure of the main scale patterns 126-1 to 126-9 in FIG. 17A, almost no influence is exerted on the measured results of the directions and magnitudes of the comatic aberrations.

Note that the developing process is conducted after effecting the double exposure on the resist on the wafer 111 in this embodiment. However, the step of development may be omitted by using a photosensitive material (e.g., a thermoplastic resin or the like) capable of detecting the image position even at a stage of the latent image.

Further, the measuring marks formed on the reticle 107A are not limited to the main scale mark 126-1 and the vernier mark 127-1 in FIG. 17B. In short, the measuring marks may be those capable of obtaining the relative positional relationship between the main scale mark image and the vernier mark image. Multiple sets of main scale and vernier marks are formed in the forming subareas of one set of the main scale and vernier marks 126-1, 127-1 in, e.g., FIG. 17A. A result of an averaged relative positional difference between the vernier mark image and the main scale mark image which is measured in each set is taken as a relative positional difference in that measuring subarea. It is thus possible to reduce an influence of a stepping error of the wafer stage 110 during the double exposure.

Next, a third embodiment of the present invention will be discussed with reference to FIGS. 16 and 21A to 23. This embodiment is also applied to the projection exposure apparatus in FIG. 16.

Figure 21A:
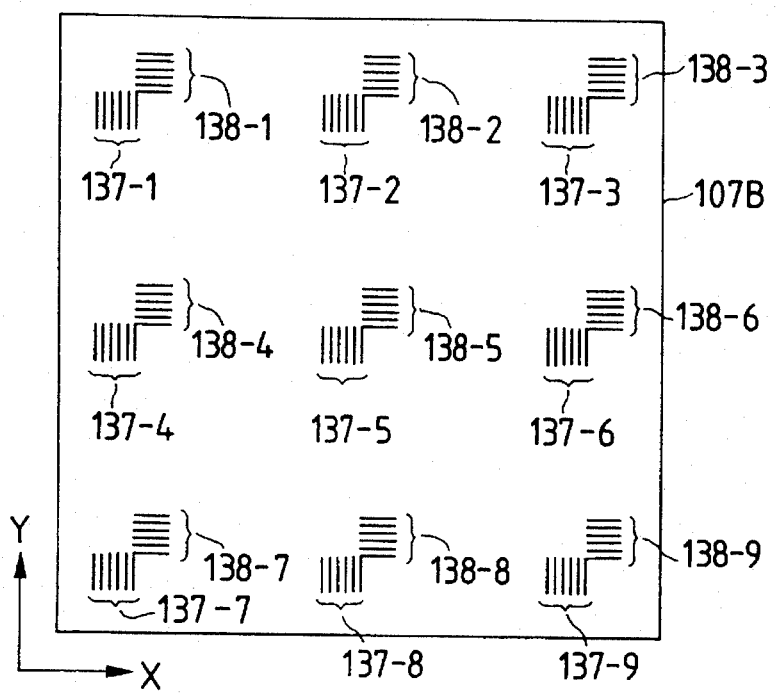
FIG. 21A is a view illustrating a configuration of the reticle used in a third embodiment of this invention; FIG.

FIG. 21A illustrates a specific configuration of a reticle 107B used in this embodiment. Referring to FIG. 21A, the reticle pattern 107B is configured such that X-directional measuring marks 137-1, 137-2, . . . 137-9 taking the same shape are formed in nine positions on the pattern forming surface; and, at the same time, Y-directional measuring marks 138-1, 138-2, . . . , 138-9 taking the same shape are formed in the vicinities of the X-directional measuring marks, respectively. The X-directional measuring mark 137-1 consists of L/S patterns, wherein light shielding portions and light transmitting portions each having a width of 5 μm are alternately arranged in the X-direction. The Y-directional measuring mark 138-1 consists of the L/S patterns, wherein the light shielding portions and light transmitting portions each having the width of 5 μm are alternately arranged in the Y-direction.

Figure 21B:
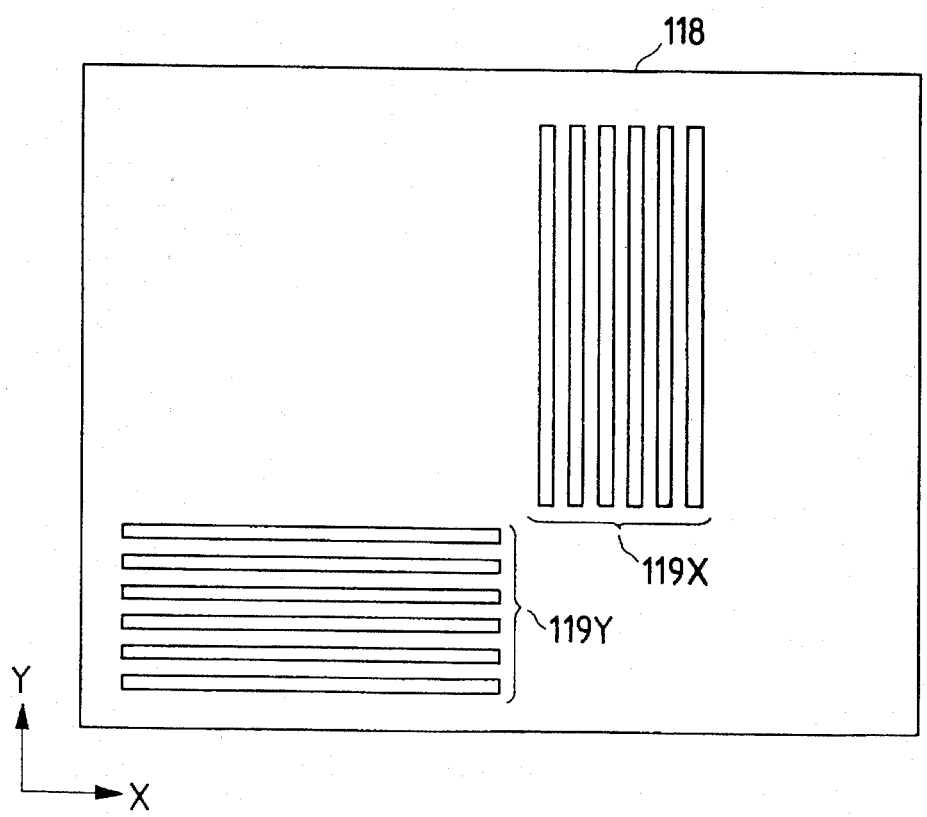

FIG. 21B illustrates the patterns formed on the fiducial mark plate 118 in FIG. 16. In FIG. 21B, X-and Y-directional fiducial marks 119X, 119Y are formed on the fiducial mark plate 118. The X-directional fiducial mark 119X consisting of the L/S patterns each having a width of 1 μm is formed in the X-direction. The Y-directional fiducial mark 119Y consisting of the L/S patterns each having the width of 1 μm is formed in the Y-direction. Therefore, the X-directional measuring marks 137-1 to 137-9 and the X-directional fiducial mark 119X on the reticle 107B are conjugate with respect to the projection optical system 109. The Y-directional measuring marks 138-1 to 138-9 and the Y-directional fiducial mark 119Y on the reticle 107B are conjugate with respect to the projection optical system 109.

Given next is an explanation of one example of obtaining a comatic aberration of the projection optical system 109. In this case, the reticle 107B in FIG. 21A is mounted as the reticle 107 in FIG. 16. The comatic aberration of the projection optical system 109 is measured by the following steps.

[First Step]

A position (focus position) on the mark forming face (surface) of the fiducial mark plate 118 in FIG. 16 in the optical axis direction of the projection optical system 109 is set apart, e.g., approximately −1.5 μm from the best focus position. The focus position on the fiducial mark plate 118 can be detected by the auto-focus systems 114a, 114b. Thereafter, the fiducial marks 119X, 119Y are illuminated with the exposure light from the lower surface of the fiducial mark plate 118 through the light guide 123 in FIG. 16. In this state, the fiducial mark plate 118 is scanned in the X- and Y-directions within the exposure field of the projection optical system 109.

In this instance, a projected image of the X-directional fiducial mark 119X on the fiducial mark plate 118 coincides with each of the X-directional measuring marks 137-1 to 137-9 on the reticle 107B. Then, a detection signal of the photoelectric converting element 120 is maximized. Based on this fact, the measuring coordinates of the laser interferometer 113 are sampled at a peak position of the detection signal, thereby detecting an X-directional position of each of the X-directional measuring marks 137-1 to 137-9. Similarly, when the projected image of the Y-directional fiducial mark 119Y on the fiducial mark plate 118 coincides with each of the Y-directional measuring marks 138-1 to 138-9 on the reticle 107B, the detection signal of the photoelectric converting element 120 is maximized. From this fact, a Y-directional position of each of the Y-directional measuring marks 138-1 to 138-9 is detected.

[Second Step]

The focus position of the fiducial mark plate 118 is sequentially varied from the position in the first step at an interval of 0.5 μm. The focus position is finally varied to a position spaced +1.5 μm from the best focus position. The first step is repeatedly executed in every focus position, thus detecting the X-directional positions of the X-directional measuring marks 137-1 to 137-9 of the reticle 107B and the Y-directional positions of the Y-directional measuring marks 138-1 to 138-9 thereof.

[Third Step]

For example, it is presumed that a relative positional difference Qx involves the use of a difference between the X-directional position of the projected image of the X-directional measuring mark 137-1 in FIG. 21 which is measured in the first and second steps and the X-directional design position of the projected image when the projection optical system 109 bears no aberration. When plotting this relative positional difference Qx in the focus position F, a quadratic curve is obtained as shown in FIG. 22. Now, there is presumed a quadratic function Q1 (F) of the focus position F expressed by coefficients d, e, f. Obtained by, e.g., the least squares method are the coefficients d, e, f when the relative positional difference Qx is best approximated as follows:

$$Qx = Q1\ (F) = dF^2 + eF + f \qquad (2)$$

Obtained beforehand by the calculation in this case is a relationship between the coefficient d of the square term of the quadratic function Q1 (F) and an X-directional comatic aberration quantity of the projection optical system 109 in the projecting position of the X-directional measuring mark 137-1. This relationship becomes as shown in, e.g., FIG. 23. It is therefore possible to acquire the X-directional comatic aberration quantity of the projection optical system 109 in the projecting position of the measuring mark 137-1 by applying the coefficient d to this relationship. It is also feasible to obtain the Y-directional comatic aberration quantity of the projection optical system 109 in the projecting position of the Y-directional measuring mark 138-1 from a relationship between the previously obtained comatic aberration quantity and the coefficient of the square term when the Y-directional relative positional difference Qy of the projected image of the Y-directional measuring mark 138-1 is approximated by the quadratic function of the focus position F. Similarly, the X- and Y-directional comatic aberration quantities of the projection optical system 109 in the respective projecting positions of the remaining X-directional measuring marks 137-2 to 137-9 and the Y-directional measuring marks 138-1 to 138-9 in FIG. 21A can be obtained from the relationship acquired beforehand and the relative positional difference as well.

In this way, according to the present embodiment, it is possible to extremely quickly obtain the X- and Y-directional comatic aberration quantities in the multiplicity of measuring subareas of the projection optical system 109 simply by scanning the fiducial mark plate 118 in the X- and Y-directions within the exposure field of the projection optical system 109 without performing the exposure on the wafer 111. Further, a measurement reproducibility is improved because of undergoing no influence of the developing process.

Note that the fiducial marks 119A, 119Y formed on the fiducial mark plate 118 and the measuring marks 137-1, 138-1 formed on the reticle 107B are not respectively confined to the L/S patterns. For instance, if a single piece of cross mark substitutes for the measuring marks 137-1, 138-1, a single piece of cross mark can also substitute for the fiducial marks 119X, 119Y.

By the way, in the second and third embodiments discussed above, the relative positional difference Px or Qx is each approximated by the quadratic function of the focus position F. The relative positional difference Px or Qx may be approximated by, e.g., a function including $\alpha \cdot \cos(\beta F)$ ($\alpha$, $\beta$ are the coefficients) defined as a cosine of the focus position F. To generalize this, if the focus position F is expressed with the best focus position being an origin, the relative positional difference Px or Qx is approximated in the form including an arbitrary function f symmetric with respect to the focus position F expressed such as $f(F)=f(-F)$. Then, a coefficient of the function f is obtained. The comatic aberration quantity can be quickly obtained by applying the coefficient obtained by the approximation thereof to a relationship between the previously obtained coefficient of the function f and the comatic aberration.

The measuring methods in the second and third embodiments are applicable to a case of measuring an asymmetric aberration of the optical system of an apparatus generally incorporating a means for measuring a position of a projected image as well as to a case of measuring the comatic aberration of the projection optical system.

It is apparent that, in this invention, a wide range of different working modes can be formed without deviating from the spirit and scope of the invention. This invention is not restricted to the specific embodiments described herein, its scope being defined by the appended claims.

What is claimed is:

1. A method of measuring an asymmetric aberration of a projection optical system which is disposed in an exposure apparatus for forming, on a substrate, a pattern image formed on a mask, said method comprising:

performing a first exposure of each of a plurality of areas on a photosensitive plate by a first pattern image projected by said projection optical system, with said photosensitive plate being disposed at a same position in a direction of an optical axis of said projection optical system for each exposure;

performing a second exposure of each area by a second pattern image projected by said projection optical system, with each area being disposed at a different respective position in the optical axis direction and the respective position of each area also being different from the position in the optical axis direction during the first exposure;

detecting a relative deviation quantity between said first pattern image and said second pattern image in each of said plurality of areas; and determining the asymmetric aberration of said projection optical system based on said detected deviation quantities.

2. A method according to claim 1, further comprising a step of determining a relation of the detected deviation quantities to the respective positions of said areas in the direction of the optical axis.

3. A method according to claim 2, wherein a parameter of a function representing said relation as a variable of position in the direction of the optical axis is calculated based on the detected deviation quantities.

4. A method according to claim 3, wherein a relation of said parameter of the function with the asymmetric aberration of the projection optical system is obtained and the asymmetric aberration of the projection optical system is determined based on that relation and said calculated parameter.

5. A method according to claim 3, wherein said asymmetric aberration is coma and said function is a quadratic function or cosine function.

6. A method according to claim 1, wherein in said detecting step, latent images of said first and second pattern images which are formed on said photosensitive plate are detected.

7. A method according to claim 1, wherein said photosensitive plate is provided with a photoresist and, after being exposed by said first and second pattern images, is subjected to a developing process, and wherein photoresist patterns of said first and second pattern images formed on the developed plate are detected in said detecting step.

8. A method according to claim 1, wherein the deviation quantity at each of said plurality of areas is detected using an alignment sensor of said exposure apparatus.

9. A method according to claim 1, wherein said photosensitive plate is constituted by a plate including said substrate and photoresist formed thereon.

10. A method of measuring asymmetric aberration of a projection optical system which is arranged in an exposure apparatus for forming, on a substrate, a pattern image formed on a mask, said method comprising:

detecting a measuring pattern arranged at an object side of said projection optical system, through said projection optical system and a plate set at each of a plurality of positions in a direction of an optical axis of said projection optical system, and, based on the detection results, determining a coordinate position of said measuring pattern in a direction perpendicular to the optical axis at each of said plurality of positions;

detecting a deflection between a fiducial position of said measuring pattern and each of said plurality of detected coordinate positions;

calculating a parameter of a function showing a relation of said detected deflection with the corresponding position in the direction of the optical axis; and determining the asymmetric aberration of said projection optical system based on the calculated parameter.

11. A method according to claim 10, wherein the asymmetric aberration is coma and said function is a quadratic function or cosine function.

\* \* \* \* \*